US012696400B2

(12) United States Patent
Kim et al.

(10) Patent No.: US 12,696,400 B2
(45) Date of Patent: Jul. 28, 2026

(54) CASE FOR MEMORY OR DATA STORAGE

(71) Applicant: SK hynix Inc., Gyeonggi-do (KR)

(72) Inventors: Jong Won Kim, Gyeonggi-do (KR); Gi Taek Kim, Gyeonggi-do (KR); Joon Ki Paek, Gyeonggi-do (KR); Jung Hee Cho, Gyeonggi-do (KR); Dong Hae Lee, Gyeonggi-do (KR); Kyoung Soo Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 165 days.

(21) Appl. No.: 18/171,660

(22) Filed: Feb. 21, 2023

(65) Prior Publication Data

US 2024/0130053 A1    Apr. 18, 2024

(30) Foreign Application Priority Data

Oct. 12, 2022    (KR) ........................ 10-2022-0130661

(51) Int. Cl.
H05K 5/00        (2025.01)
(52) U.S. Cl.
CPC .................................. H05K 5/0052 (2013.01)
(58) Field of Classification Search
None
See application file for complete search history.

(56) References Cited

U.S. PATENT DOCUMENTS

| | | | |
|---|---|---|---|
| 7,517,231 B2 | 4/2009 | Hiew et al. | |
| 8,797,763 B2 | 8/2014 | Fukunaga et al. | |
| 10,346,735 B1 * | 7/2019 | Lee ........................... | G06F 1/00 |
| 10,477,706 B1 * | 11/2019 | Wang ................... | H05K 5/0247 |
| 2007/0064403 A1 * | 3/2007 | Badarinarayan ... | B23K 20/1265 361/796 |
| 2007/0217172 A1 * | 9/2007 | Bisbikis ............... | H05K 9/0016 361/753 |
| 2011/0261526 A1 * | 10/2011 | Atkins .................... | G06F 1/187 361/679.33 |
| 2012/0026674 A1 * | 2/2012 | Aldridge ................. | G06F 1/187 361/679.33 |
| 2013/0213708 A1 * | 8/2013 | Chitaka .................. | H05K 5/061 174/559 |
| 2017/0188473 A1 * | 6/2017 | Suzuki ................. | H05K 5/0043 |
| 2018/0206348 A1 * | 7/2018 | Funahashi ........... | H05K 5/0047 |
| 2018/0249585 A1 * | 8/2018 | Yoshida ................ | H05K 1/181 |
| 2021/0014991 A1 * | 1/2021 | Chang .................. | H05K 5/0247 |
| 2022/0344243 A1 * | 10/2022 | Hur ....................... | H01L 23/467 |

* cited by examiner

*Primary Examiner* — Allen L Parker
*Assistant Examiner* — Christopher L Augustin
(74) *Attorney, Agent, or Firm* — IP & T GROUP LLP

(57)        ABSTRACT
A storage device includes a printed circuit board (PCB) with attached semiconductor chips, each including a memory, and with at least one wire coupling the semiconductor chips. The storage device includes a case including a first case surrounding a top portion of the printed circuit board and a second case surrounding a bottom portion of the printed circuit board. A sidewall of the first case and a protrusion of the second case form a concavo-convex structure. The sidewall of the first case and the protrusion of the second case cover a side of the printed circuit board.

20 Claims, 30 Drawing Sheets

106

GND dB(A/m)

150

106

GND dB(A/m)

CHAGE OF THICKNESS
$D_{front\_out}$

PCB Bottom Layer

102/104

CASE FOR MEMORY OR DATA STORAGE

CROSS-REFERENCE TO RELATED APPLICATIONS

This patent application claims the benefit of priority under 35 U.S.C. § 119(a) to Korean Patent Application No. 10-2022-0130661, filed on Oct. 12, 2022, the entire disclosure of which is incorporated herein by reference.

TECHNICAL FIELD

One or more embodiments of the present disclosure described herein relate to a storage, and more particularly to a case, for use with a memory device or a data storage device.

BACKGROUND

In a computing system, the amount of computation needed is increasing in response to user's needs. Due to the increase in the amount of computation, the amount of data generated or stored in the computing system is also increasing. To support an increased amount of computation and to store the large amount of generated data, a data storage structure or a data infrastructure including a plurality of storage devices has been used. The data storage structure or the data infrastructure may also be understood as a data center or a data server. The data storage structure or the data infrastructure may have a plurality of storage devices that are integrated in order to install more storage devices in a limited space. Damage due to electro-static discharge (ESD) may occur in a structure in which a plural ty of memory systems or a plurality of storage devices are integrated. The electro-static discharge (ESD) may be a sudden discharge of grounded static electricity. Sensitive components such as a memory system could be damaged if the memory system is in the current path when a discharge occurs.

BRIEF DESCRIPTION OF THE DRAWINGS

The description herein makes reference to the accompanying drawings wherein like reference numerals refer to like parts throughout the figures.

FIGS. 5A and 5B illustrate a difference in shielding performance according to a change In a protrusion height described in FIG. 4 according to an embodiment of the present disclosure.

FIGS. 7A and 7B describe a difference in shielding performance according to a change of an outer wall height described in FIG. 4 according to an embodiment of the present disclosure.

FIGS. 11A and 113 describe a structural difference based on positions of the outer wall and the protrusion described in FIG. 4 according to an embodiment of the present disclosure.

DETAILED DESCRIPTION

Figure 1:
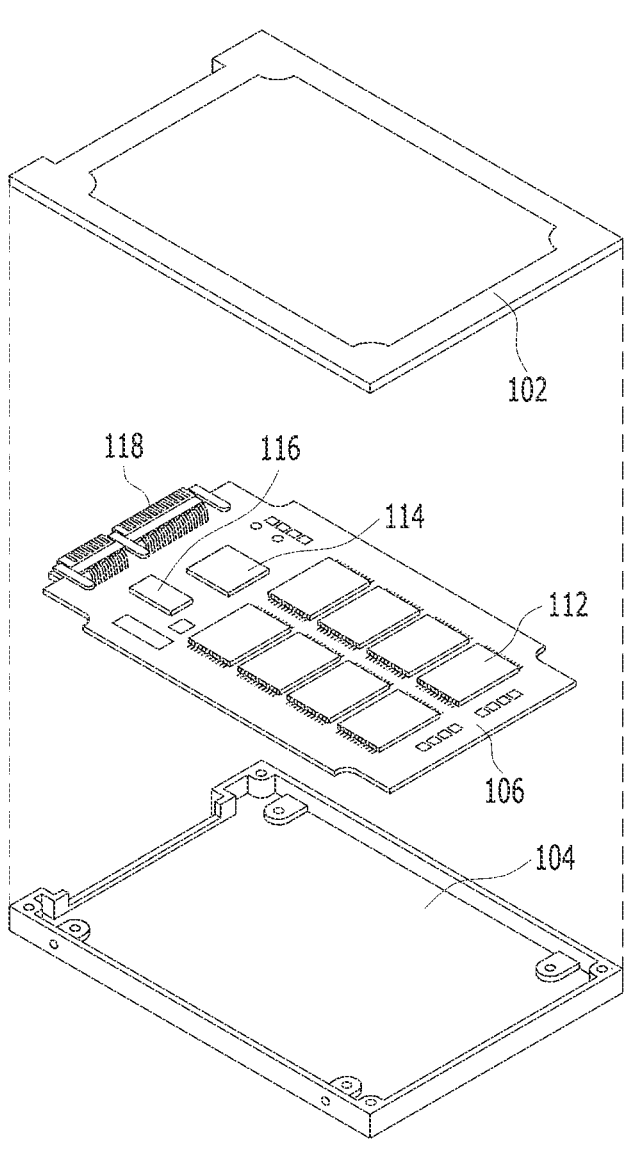
FIG. 1 illustrates a storage device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Embodiments described herein provide an apparatus and a method capable of maintaining the performance of a memory device or a data storage device included in a data storage structure or a data infrastructure.

In an embodiment, a storage device can include a printed circuit board (PCB) with attached semiconductor chips, each including a memory, and with at least one wire coupling the semiconductor chips; and a case comprising a first case surrounding a top portion of the printed circuit board and a second case surrounding a bottom portion of the printed circuit board, wherein a sidewall of the first case and a protrusion of the second case form a concavo-convex structure, and the sidewall of the first case and the protrusion of the second case cover a side of the printed circuit board.

The storage device can further include a carrier attached with the case and configured to couple the case to a rack which is capable of arranging plural storage devices in a row direction, a column direction, or row and column directions. The carrier can include at least one component coupled to a ground voltage.

The sidewall can meet the protrusion, when the first case and second case are joined to each other, such that a crack between the sidewall and the protrusion in the concavo-convex structure extends from between the printed circuit board and the second case to between the printed circuit board and the first case.

The case can further include an inner portion arranged on an inner side of the sidewall, the inner portion corresponding to the protrusion. The crack can be between the protrusion and the inner portion.

The inner portion is spaced apart from the inner side of the sidewall to form a trench between the sidewall and the inner portion of the first case. The protrusion can be inserted into the trench when the first case and the second are joined to each other.

The first case and the second case can have a detachable structure. The crack can correlate with an assembly tolerance of the first case and the second case.

The crack can be extended from a bottom of the second case to a top of the first case.

The sidewall of the first case can be arranged outside the protrusion of the second case. The protrusion of the second case can be arranged with the printed circuit board in a space formed by the sidewall of the first case.

The PCB can include a hole, through which the first case to the second case are to be coupled to each other.

In another embodiment, an electrical apparatus can include a printed circuit board and first and second cases covering a top and a bottom of the printed circuit board. The first and second cases can be detachable. A sidewall of the first case and a protrusion of the second case can cover a side of the printed circuit board.

The first case can include an inner portion arranged on an inner side of the sidewall, the inner portion corresponding to the protrusion.

The inner portion and the sidewall can be attached to each other without any space.

The protrusion can be inserted into a trench formed between the inner portion and the sidewall.

The inner portion and the protrusion can have a same height.

The sidewall, the protrusion, and the inner portion can form a concavo-convex structure. A crack between the sidewall and the protrusion can extend from between the printed circuit board and the second case to between the printed circuit board and the first case.

The crack can correlate with an assembly tolerance of the first case and the second case.

The electrical apparatus can further include a carrier attached with the case and configured to couple the case to a rack which is capable of arranging plural storage devices in a row direction, a column direction, or row and column directions.

The carrier can include at least one component coupled to a ground voltage.

The PCB can include a hole, through which the first case to the second case are to be coupled to each other.

The printed circuit board is spaced apart respectively from and the first case the second case by a same distance.

In another embodiment, a shielding case for a printed circuit board (PCB) can include an upper cover having an upper side wall forming a space to accommodate the PCB; and a lower cover having a lower side wall. The upper side can have a stepped portion in a thickness direction at an end thereof. The lower side wall can be joined into the stepped portion in a concavo-convex manner for a combination of the upper and lower covers with each other.

Embodiments will now be described with reference to the accompanying drawings, wherein like numbers reference like elements.

FIG. 1 illustrates a storage device according to an embodiment of the present disclosure.

Referring to FIG. 1, a storage device can include a printed circuit board (PCB) 106 on which a plurality of semiconductor chips, each including a memory, are attached or arranged. The PCB 106 is formed with at least one wire connecting the plurality of semiconductor chips. An upper case 102 may cover an upper or top portion of the printed circuit board 106, and a lower case 104 may cover a lower or bottom portion of the printed circuit board 106.

According to an embodiment, the memory in the plurality of semiconductor chips 112 disposed on the printed circuit board 106 can include a memory including a plurality of volatile memory cells or a plurality of non-volatile memory cells. Further, another semiconductor chip 116 including a memory including the plurality of volatile memory cells is attached on the printed circuit board 106. Further, another semiconductor chip 114 including a controller for controlling data input/output operations, to/from the memory, can be disposed on the printed circuit board 106.

According to an embodiment, an interface device such as an input/output port for data or signals or an interconnector 118 for performing data communication can be included in, or attached on, the printed circuit board 106. For example, the printed circuit board 106 can include an input/output port or the interconnector 118 including at least one pin or pad designed to be connected to a socket of an external device (e.g., a rack, a board, etc.).

The upper case 102 and the lower case 104 can not only protect the printed circuit board 106 included therein from an impact applied from an outside of the storage device, but also release a heat generated on or from the printed circuit board 106 to the outside. In addition, the upper case 102 and the lower case 104 can be designed to reduce or avoid a damage, due to electro-static discharge (ESD), occurring in the semiconductor chips 112, 114, 116 attached, or formed, on the printed circuit board 106.

Generally, static electricity is an imbalance of electric charges within or on the surface of a material or between materials. The charge may remain until it is able to move away by means of an electric current or electrical discharge. The electro-Static Discharge (ESD) is a phenomenon in which static electricity existing without any movement of charges is discharged. For example, the most common of static electricity that does not move is triboelectricity. Triboelecticity is a type of contact electrification on which certain materials become electrically charged after the certain materials are separated from a different material with which the certain materials were in contact. Rubbing two materials with each other increases the contact between their surfaces, so that the two materials could be electrically charged (e.g., have electrical polarity) by the triboelectric effect. This generated electricity does not dissipate and might be accumulated on the materials. The accumulated electricity might flow rapidly when any material touches a conductor. Or the accumulated electricity might move to balance the charge when the charged material comes into contact with another material/object which is charged with a different pole. This phenomenon is an example of electro-static discharge (ESD).

For example, the electro-static discharge (ESD) could occur from contact charging, e.g., friction and contact/separation of objects or materials. When two objects rub against each other or are attached to each other for a certain period of time and then suddenly fall apart, electrons in atoms might gain energy due to frictional heat between the two objects, resulting in an unstable state. That is, when the electrons try to pull external electrons or discard surplus electrons in order to return from an unstable state to a stable state, a sudden charge transfer may occur in a form of electrical discharge. In addition, the electro-static discharge (ESD) could occur from inductive charging, e.g., an already charged object. When an object is charged and comes close to another object in a stable state which is not charged, the another object could become charged or electrified when gravitation causes it to be charge imbalanced.

Like the storage device described in FIG. 1, a component such as a disk drive or a solid-state drive (SSD) included in, or coupled to, a desktop or a notebook computer might be damaged if the component is located in a current discharge path when a discharge occurs. A damage due to the electro-static discharge (ESD) could occur when charges accumulated on a hand or a tool are coupled to a current discharge path having a less resistance to the disk drive or the solid-state drive (SSD). Damage can occur if a maximum amount of energy capable of burning out a component of the disk drive when currents flow in the discharge path might be less than a charging energy based on accumulated charges. In the disk drive or the solid-state drive (SSD) included in the desktop or the notebook computer, a wire or a path such as a small metal foil formed on or in the printed circuit board 116 is generally designed to handle a very small amount of voltage or current. Thus, the wire or the path could be broken (e.g., burned out) by the electro-static discharge (ESD). Even though the damage occurs in a partial portion of the wire or the path, signals or data passing through the wire or the path could not be transferred fast, thereby making it difficult for the storage device to perform I/O operations at a high speed.

According to an embodiment, coupling or separation of the upper case 102 and the lower case 104 may be achieved through a fastening structure using a screw, a snap-fit, or the like. When a plurality of semiconductor chips disposed on the printed circuit board 106 do not operate normally, the upper case 102 and the lower case 104 can be separated so as to replace a damaged printed circuit board with a printed circuit board on which a plurality of normally operating semiconductor chips are disposed.

Figure 2A:
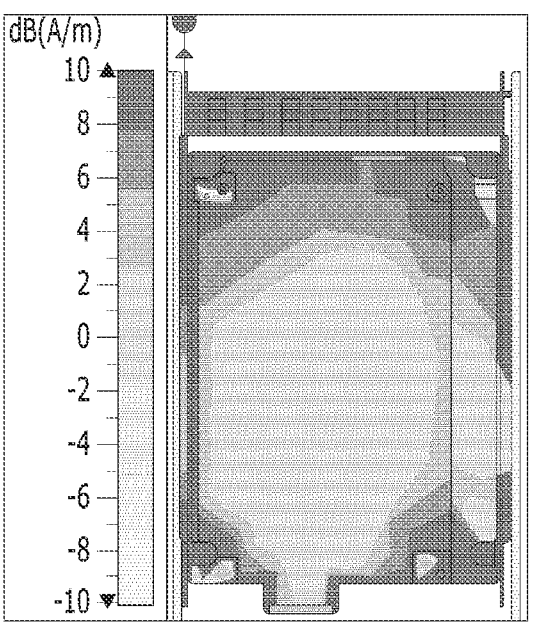
FIGS. 2A and 2B illustrate a difference in shielding performance according to the presence or absence of a concavo-convex structure in the storage device described in FIG. 1 according to an embodiment of the present disclosure.
Figure 2A:
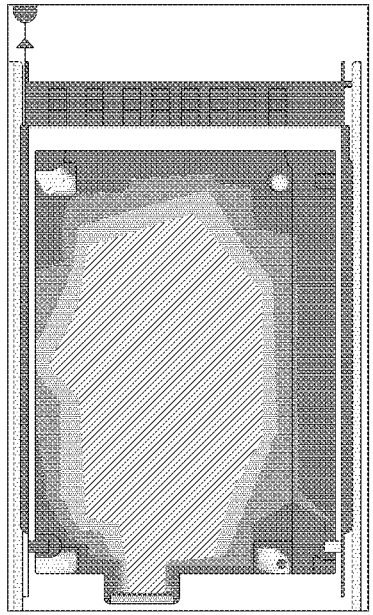
Figure 2B:
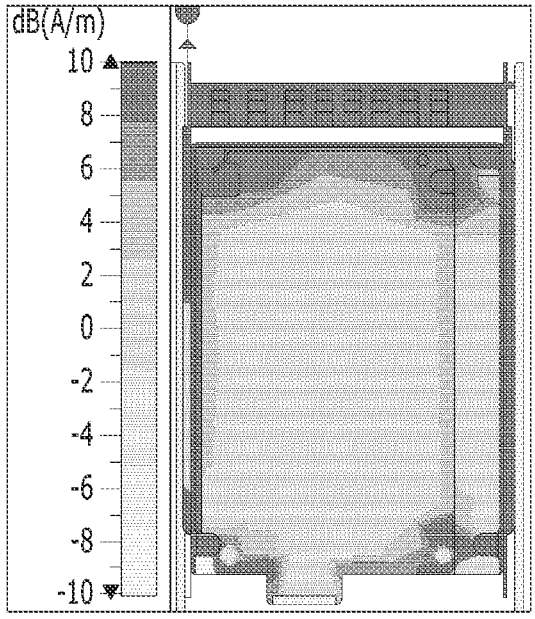
Figure 2B:
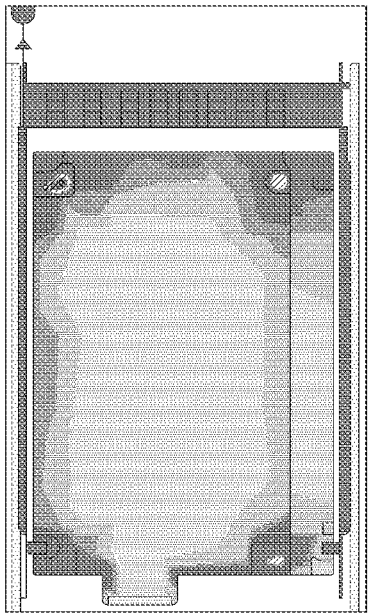

FIGS. 2A and 2B illustrate a difference in shielding performance according to the presence or absence of a concavo-convex structure in the storage device described in FIG. 1 according to an embodiment of the present disclosure. FIG. 2A shows a case without a concavo-convex structure, and FIG. 2B shows a case with a concavo-convex structure. FIGS. 2A and 2B show patterns of magnetic field strength (unit: A/m) based on surface currents on a printed circuit board. An electro-static discharge test (ESD Test) can use a contact discharge method in which static electricity with a voltage of up to ±4 kV is applied in contact with a conductive material of the storage device.

Here, an uneven (e.g., concavo-convex) structure may occur in a region in which the upper case 102 and the lower case 104 are coupled. If one of the upper case 102 and the lower case 104 includes a side wall covering a side of the storage device, but the other of the upper case 102 and the lowercase 104 does not have a structure corresponding to the side wall, a concavo-convex structure might not exist in the region in which the upper case 102 and the lower case 104 are coupled. Conversely, when the upper case 102 and the lower case 104 individually include a structure capable of covering the side of the storage device and structures of the upper case 102 and the lower case 104 are partially overlapped with each other, the region in which the upper case 102 and the lower case 104 are joined has the uneven (e.g., concavo-convex) structure. The uneven structure will be described later with reference to FIG. 4.

FIGS. 2A and 2B respectively show surface currents on a printed circuit board (PCB) 106 in the upper case 102 (left in the drawing) and lower case 104 (right in the drawing). A magnetic field strength (dB, A/m) due to the surface current in a case with the concavo-convex structure (FIG. 2B) could be generally lower on both surfaces, i.e., both aspects of the upper case 102 (left) and the lower case 104 (right) than that in a case without the concavo-convex structure (FIG. 2A). That is, when the upper case 102 and the lower case 104 are coupled, the concavo-convex structure is formed through the structures included in the upper case 102 and the lower case 104. Damage caused by static-electricity discharge (ESD) could be reduced in the case where there is concavo-convex structure, rather than in the case where there is no concavo-convex structure.

FIGS. 3A to 3E describe a difference in shielding performance according to a type of ground structure in the storage device described in FIG. 1 according to an embodiment of the present disclosure. FIGS. 3A to 3E show changes in shielding performance when a terminal of the ground voltage (GND) is differently located in the case of the storage device. Specifically, FIGS. 3A to 3E show that static electricity of 4 kV voltage can be applied through a device (e.g., ESD Gun, 150) for an electro-static discharge test (ESD Test) in a side of the printed circuit board 106 of the storage device, which is opposite to a side in which a port or interconnector connected to an external device is located.

Figure 3A:
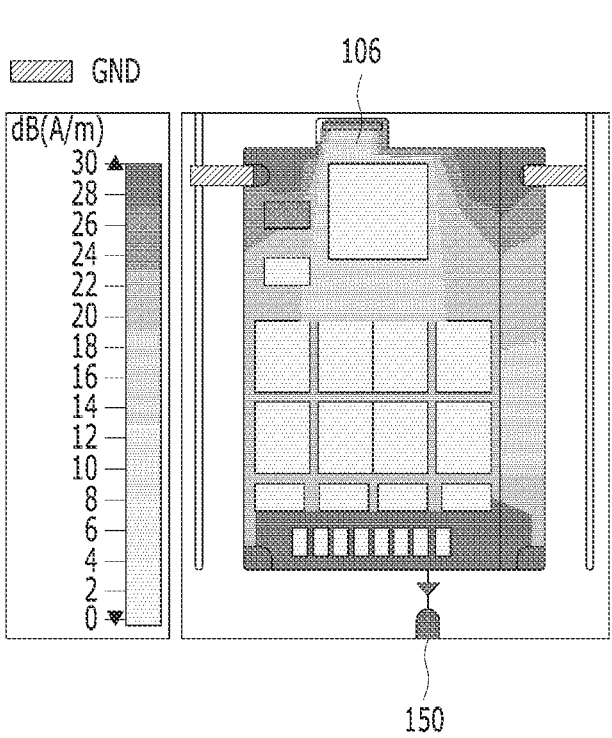
FIGS. 3A to 3E describe a difference in shielding performance according to a type of ground structure in the storage device described in FIG. 1 according to an embodiment of the present disclosure.

FIG. 3A shows a case where a ground voltage terminal of the case is arranged at corners of the printed circuit board 106 where ports or interconnectors connected to an external device are located.

Figure 3B:
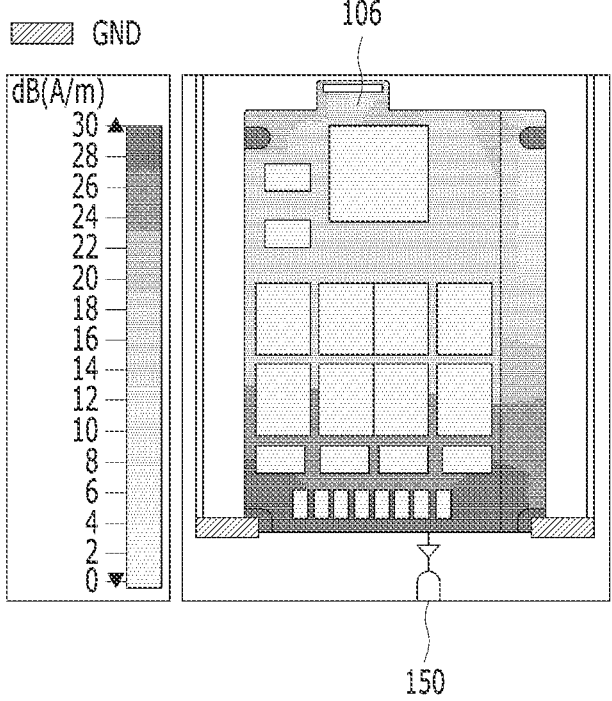

FIG. 3B shows a case where a ground voltage terminal of the case is disposed at a corner to which static electricity is applied, which is opposite to a side in which a port or an interconnector connected to an external device is located in the printed circuit board 106.

Figure 3C:
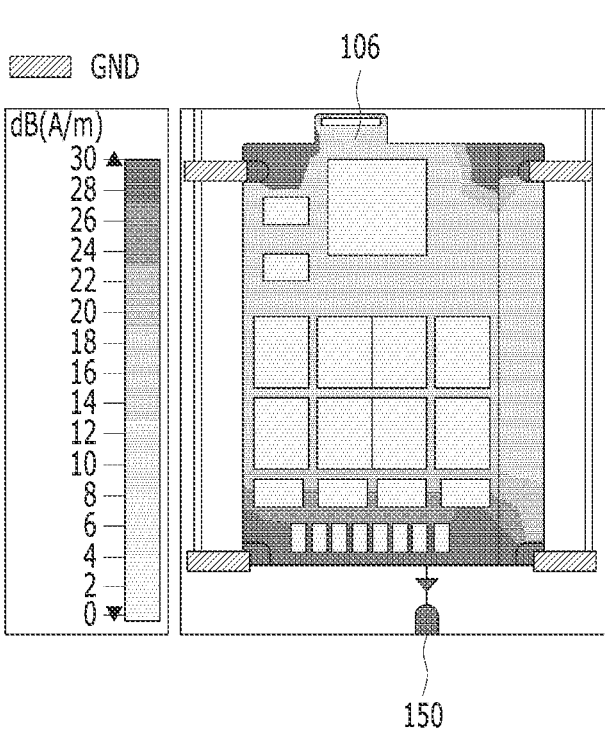

FIG. 3C shows a case where a ground voltage terminal of the case is disposed at a corner of the printed circuit board 106 where a port or an interconnector connected to an external device is located and at another corner which is opposite to the port or the interconnector where static electricity is applied.

Figure 3D:
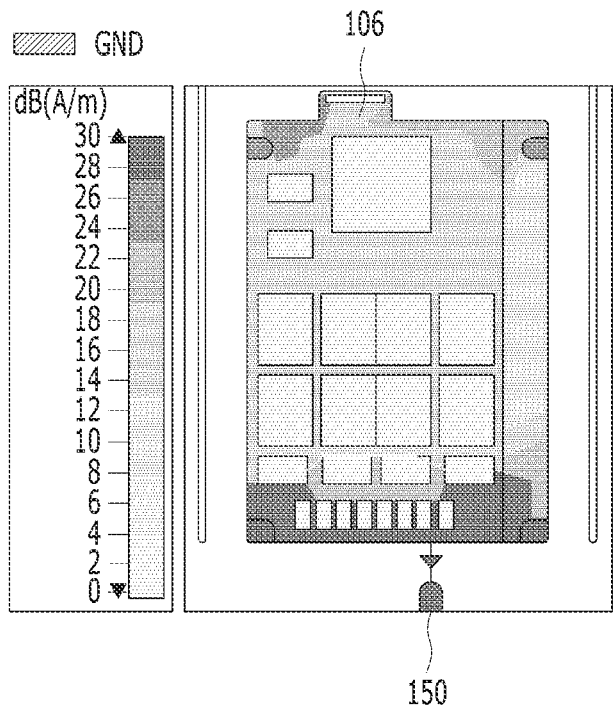

FIG. 3D is a case in which a ground voltage terminal of the case is not coupled to the ground voltage (i.e., the ground voltage terminal is floated).

Figure 3E:
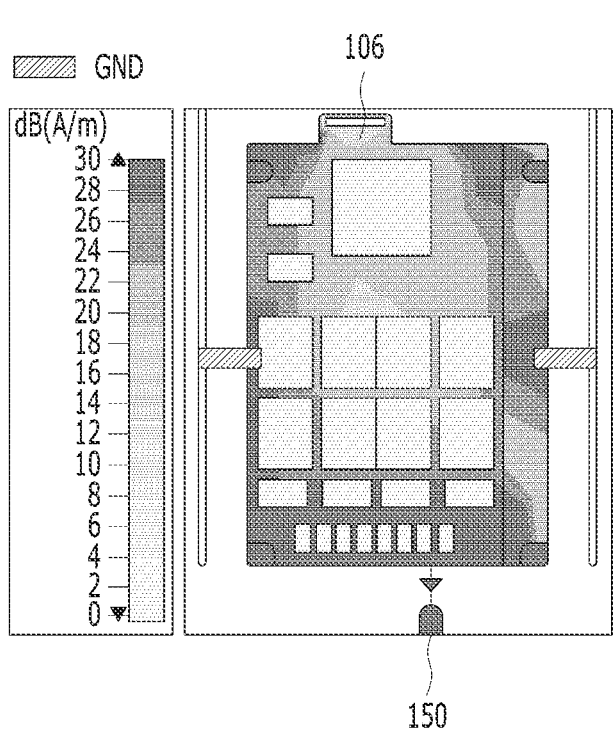

FIG. 3E shows a case in which a ground voltage terminal of the case is located at a middle region between a corner where a port or an interconnector connected to an external device in the printed circuit board 106 is located and another corner opposite to a side where the port or the interconnector is located (i.e., a corner where static electricity is applied).

Referring to FIGS. 3A to 3E, a pattern of magnetic field strength (unit: A/m) which occurred from the surface current of a printed circuit board (PCB) is changed based on a position of the ground voltage terminal of the case, which is connected to the ground voltage. The case where the ground voltage terminal connected to the ground voltage is located in the middle region of the case described in FIG. 3E can have the highest magnetic field strength pattern among five cases shown in FIGS. 3A to 3E. When the ground voltage terminal of the case described in FIG. 3D is floating (i.e., not connected to the ground voltage), the magnetic field strength is the lowest among five cases shown in FIGS. 3A to 3E. In addition, the pattern of magnetic field strength in the case when the ground voltage terminal is located farther from the location to which static electricity of 4 kV voltage is applied (see FIG. 3A) can be higher than that in the case when the ground voltage terminal is located closer to the location to which static electricity is applied (see FIG. 3B).

Figure 4:
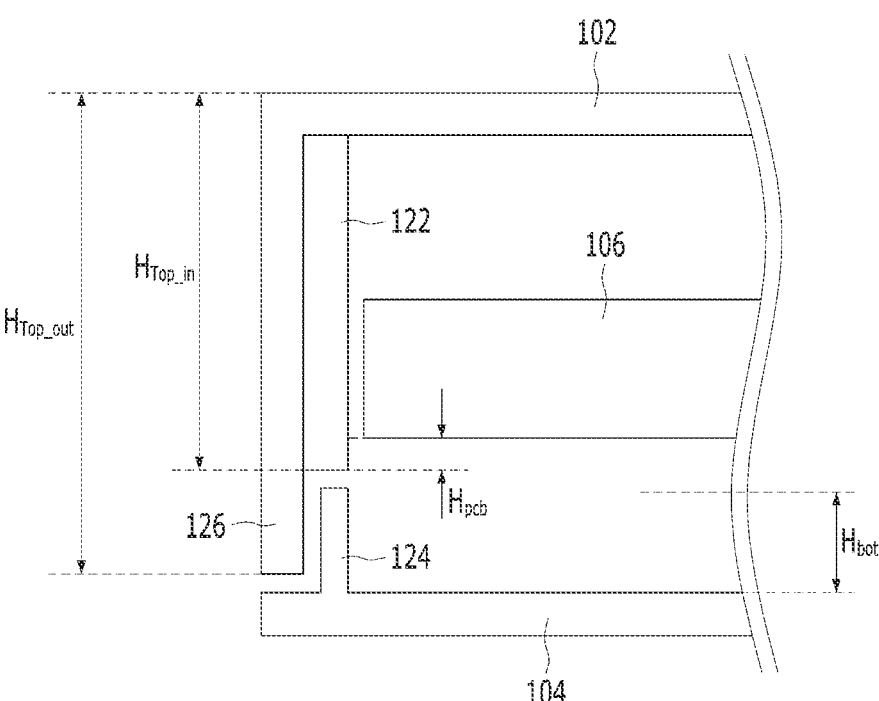
FIG. 4 describes a vertical structure of the storage device described in FIG. 1 according to an embodiment of the present disclosure.

FIG. 4 describes a vertical structure of the storage device described in FIG. 1 according to an embodiment of the present disclosure.

Referring to FIG. 4, the storage device includes the upper case 102, the lower case 104, and the printed circuit board 106. The upper case 102 includes a sidewall 126 and the lower case 104 include a protrusion 124.

According to an embodiment, the upper case 102 may further include an inner portion 122 corresponding to the protrusion 124 of the lower case 104.

According to an embodiment, a penetrated hole (e.g., Via) may be formed in the printed circuit board 106.

Figure 5A:
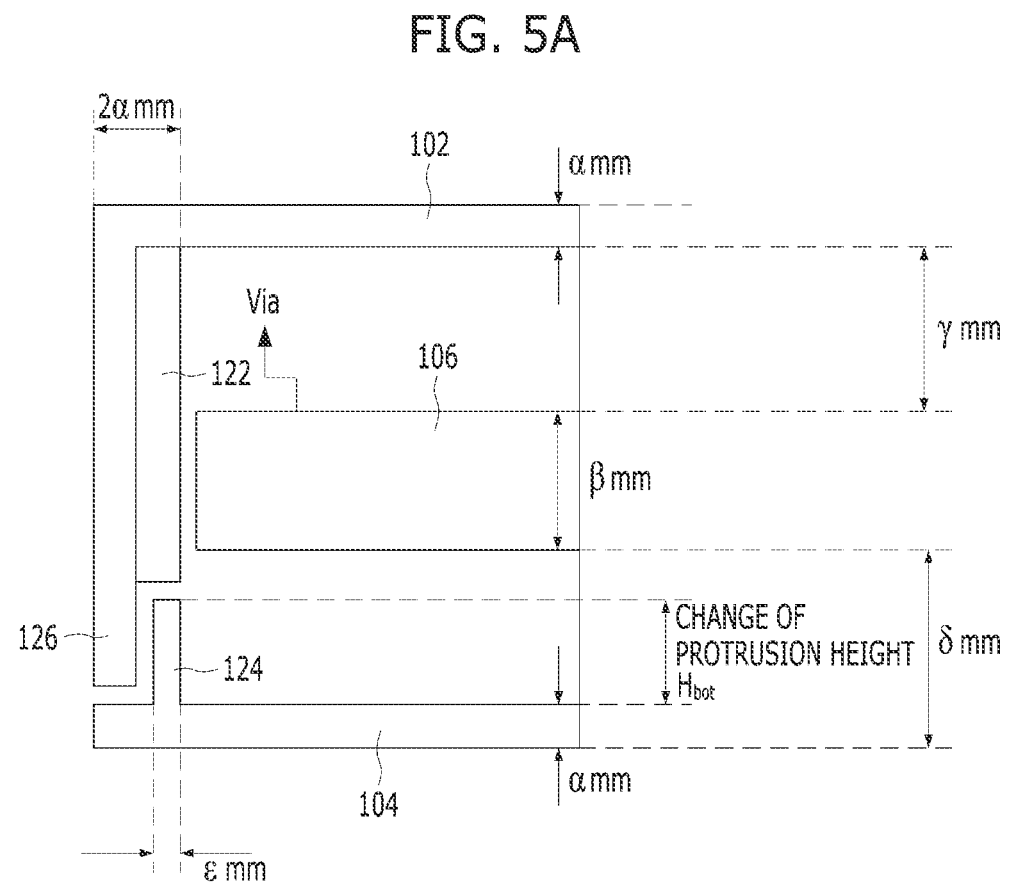

Referring to FIGS. 4 and 5A, the upper case 102 and the lower case 104 may have a thickness of α mm, and the printed circuit board 106 has a thickness of β mm. The upper case 102 and the printed circuit board 106 are spaced apart by a thickness of γ mm. The lower case 104 can be separated from the printed circuit board 106 by δ mm. Here, α, β, γ, and δ are a positive number. For example, β may have a value 2.5 to 3.5 times than α. γ and δ may be substantially same as each other, or γ may be a value greater than δ. In addition, when the thicknesses of the inner portion 122 and the upper case 102 may be substantially the same, the sum of the thicknesses of the side wall 126 and the inner portion 122 could become 2α mm. The protrusion 124 can have a thickness of ε mm smaller than α mm. A thickness difference between the inner portion 122 and the protrusion 124 could occur by an assembly tolerance. According to an embodiment, thicknesses of the components or a separation distance between the components could be changed according to a structure or a design of the storage device.

The sidewall 126 of the upper case 102 and the protrusion 124 of the lower case 104 may form an uneven (e.g., concavo-convex) structure. The concavo-convex structure may be formed along a crack caused by an assembly tolerance in a process of coupling the upper case 102 and the lower case 104. For example, the concavo-convex structure may vary depending on a height ($H_{bot}$) of the protrusion 124, a height ($H_{Top\_out}$) of the sidewall 126, the height ($H_{Top\_in}$) of the inner portion 122, and the position of the printed circuit board 106. Here, the position of the printed circuit board 106 can be described using a step ($H_{pcb}$) of the printed circuit board 106 from a crack between the inner portion 122 and the protrusion 124.

In FIG. 4, the sidewall 126 of the upper case 102 and the inner portion 122 are in contact. According to an embodiment, the sidewall 126 and the inner portion 122 may be spaced apart to form a trench between the sidewall 126 and the inner portion 122, so that the protrusion of the lower case 104 could be inserted into the trench when the upper case 102 and the lower case 104 may be coupled. In this case, a length of the concavo-convex structure formed along a crack caused by an assembly tolerance in the process of coupling the upper case 102 and the lower case 104 may be longer than that in the case without the trench.

According to an embodiment, when the height $H_{bot}$ of the protrusion 124 is changed, the height $H_{Top\_in}$ of the inner portion 122 corresponding to the protrusion 124 could be also changed. In addition, in the process of coupling the upper case 102 and the lower case 104, a position of the crack caused by assembly tolerance is changed, and the step $H_{pcb}$ of the printed circuit board 106 could be changed. In order to analyze an effect of the shielding performance when each component is changed, shielding performance based on the change of each component rather than the changes of the plurality of components is compared and analyzed below.

Hereinafter, a difference in shielding performance related to electrostatic discharge in a storage device when static electricity of a voltage of 4 kV is applied to different cases including changes such as arrangement, height, and thickness of components will be described.

Figure 5B:
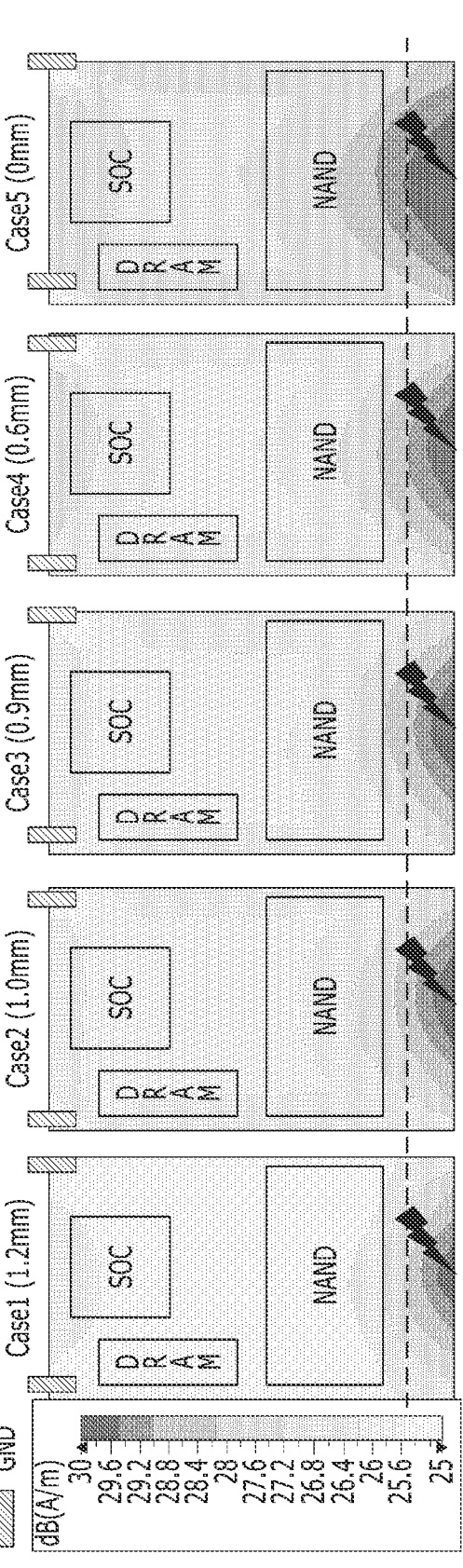

FIGS. 5A and 5B illustrate a difference in shielding performance according to a change in a protrusion height described in FIG. 4 according to an embodiment of the present disclosure.

Referring to FIG. 5A, the height $H_{bot}$ of the protrusion 124 may be designed differently. Referring to FIG. 5A, although a case (e.g., the upper case 102 and the lower case 104) is substantially similar with a coupling structure of the case in the storage device described in FIG. 4, it could be checked that shielding performance is varied based on the height $H_{bot}$ of the protrusion 124.

Referring to FIGS. 5A and 5B, when the height $H_{bot}$ of the protrusion 124 is varied but other components are not changed, a pattern of the magnetic field strength (unit: A/m) is changed. When the height $H_{bot}$ of the protrusion 124 is different but other components are not changed, a width of the crack (or interval) between the protrusion 124 and the inner portion 122 is varied according to the height $H_{bot}$ of the protrusion 124.

Referring to FIG. 5B, the height $H_{bot}$ of the protrusion 124 is set to 1.2 mm (Case1), 1 mm (Case2), 0.9 mm (Case3), 0.6 mm (Case4), and 0 mm (Case5) in five cases. A changed pattern of the magnetic field strength (unit: A/m) is measured due to the surface current of the printed circuit board (PCB). In these cases, the height $H_{bot}$ of the protrusion 124 may be smaller than δ mm, which is a separation distance between the lower case 104 and the printed circuit board 106. The higher the height $H_{bot}$ of the protrusion 124, the lower the magnetic field strength. The lower the height $H_{bot}$ of the protrusion 124, the higher the magnetic field strength. Referring to FIGS. 5A and 5B, as the length of the crack forming the concavo-convex structure is longer and the width of the crack and interval are narrower, damage caused by electro-static discharge (ESD) in the printed circuit board could be reduced.

Figure 6A:
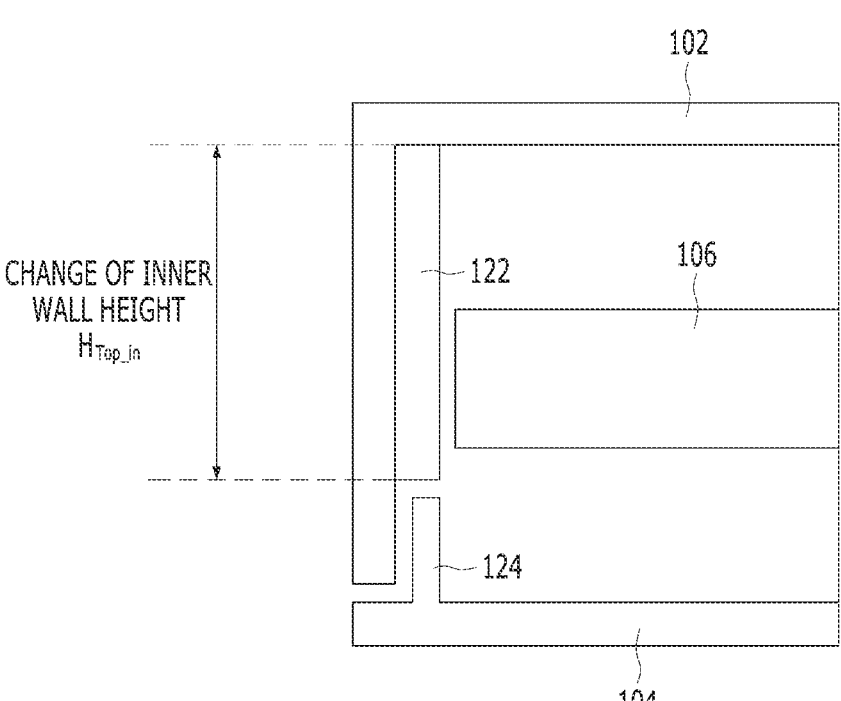
FIGS. 6A and 6B illustrate a difference in shielding performance according to a change in an inner portion height described in FIG. 4 according to an embodiment of the present disclosure.
Figure 6B:
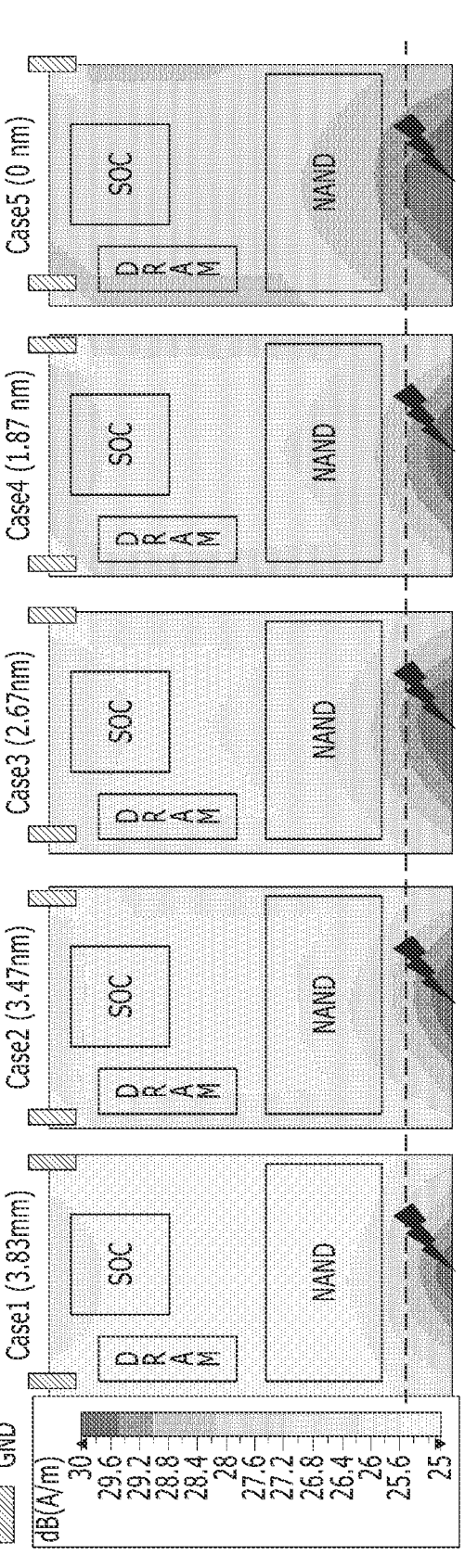

FIGS. 6A and 6B illustrate a difference in shielding performance according to a change in an inner portion height described in FIG. 4 according to an embodiment of the present disclosure.

Referring to FIG. 6A, the height $H_{Top\_in}$ of the inner portion 122 may be designed differently. Referring to FIG. 6A, a case is substantially similar with the coupling structure of the storage device described in FIG. 4. Shielding performance could be different based on the height $H_{Top\_in}$ of the inner portion 122.

Referring to FIGS. 6A and 63, when the height $H_{Top\_in}$ of the inner portion 122 is varied but other components are not changed, a pattern of the magnetic field strength (unit: A/m) could be changed. When the height $H_{Top\_in}$ of the inner portion 122 is different and other components are not changed, the width of the crack or interval between the protruding portion 124 and the inner portion 112 is changed based on the height $H_{Top\_in}$ of the inner portion 122.

Referring to FIG. 63, the height $H_{Top\_in}$ of the inner portion 122 is set to 3.83 mm (Case1), 147 mm (Case2), 2.67 mm (Case3), 1.87 mm (Case4), and 0 mm (Case5) in five cases. The changed pattern of the magnetic field strength (unit: A/m) is measured due to the surface current of the printed circuit board (PCB). Specifically, a first case (Case1)

shows that the height $H_{Top\_in}$ of the inner portion 122 is greater than both β mm, which is the thickness of the printed circuit board 106, and γ mm, which is the separation distance between the printed circuit board 106 and the upper case 102. A second case (Case2) shows that the height $H_{Top\_in}$ of the inner portion 122 is similar to both 13 mm and γ mm, Other cases (Case3 to Case5) show that the height $H_{Top\_in}$ of the inner portion 122 is lesser than both β mm and γ mm. As compared with five cases, patterns of the magnetic field strength (unit: A/m) are changed. The higher the height $H_{Top\_in}$ in of the inner portion 122, the lower the magnetic field strength. The lower the height $H_{Top\_in}$ of the inner portion 122, the higher the magnetic field strength.

Referring to FIGS. 5A, 6A, and 6B, as the height $H_{Top\_in}$, of the inner portion 122 increases, the inner portion 122 could cover the side surface of the printed circuit board 106 in a view of side. As the height $H_{Top\_in}$ of the inner portion 122 decreases, the inner portion 122 will not cover the side surface of the printed circuit board 106. For example, as described with reference to FIG. 6A, two cases (e.g., 183 mm (Case1), 147 mm (Case2)) show that the height $H_{Top\_in}$ of the inner portion 122 is greater than the sum of the thickness of the printed circuit board 106 and the separation distance between the printed circuit board 106 and the upper case 102. The shielding performance of two cases could be superior to that of the other three cases (Case3 to Case5). That is, shielding performance might be not better in three cases (Case3, Case4-Case5) when the height $H_{Top\_in}$ of the inner portion 122 is not significantly different from, and lesser than, the sum of the thickness of the printed circuit board 106 and the separation distance between the printed circuit board 106 and the upper case 102 than the other two cases (Case1, Case2).

In addition, when the height $H_{Top\_in}$ of the inner portion 122 is adjusted while the height of the protruding portion 124 is fixed, the width of the crack and interval forming the concavo-convex structure could be different. The smaller the width or spacing of the crack and interval forming the uneven structure, the less damage caused by electrostatic discharge (ESD) on the printed circuit board.

Figure 7A:
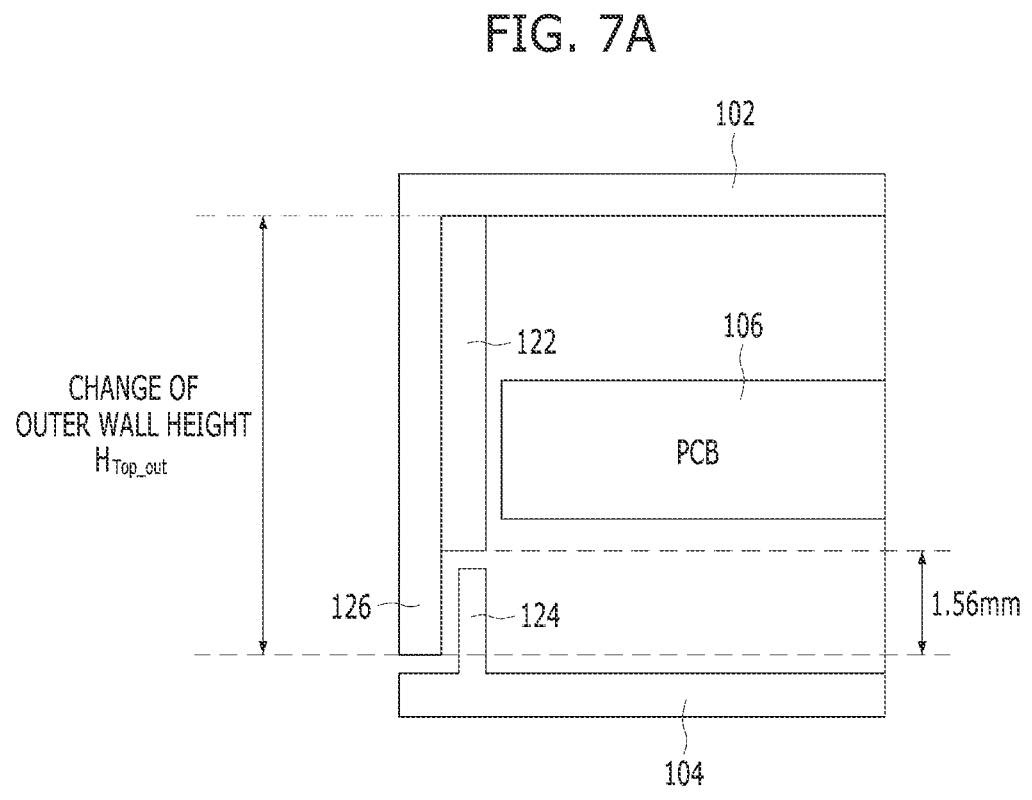
Figure 7B:
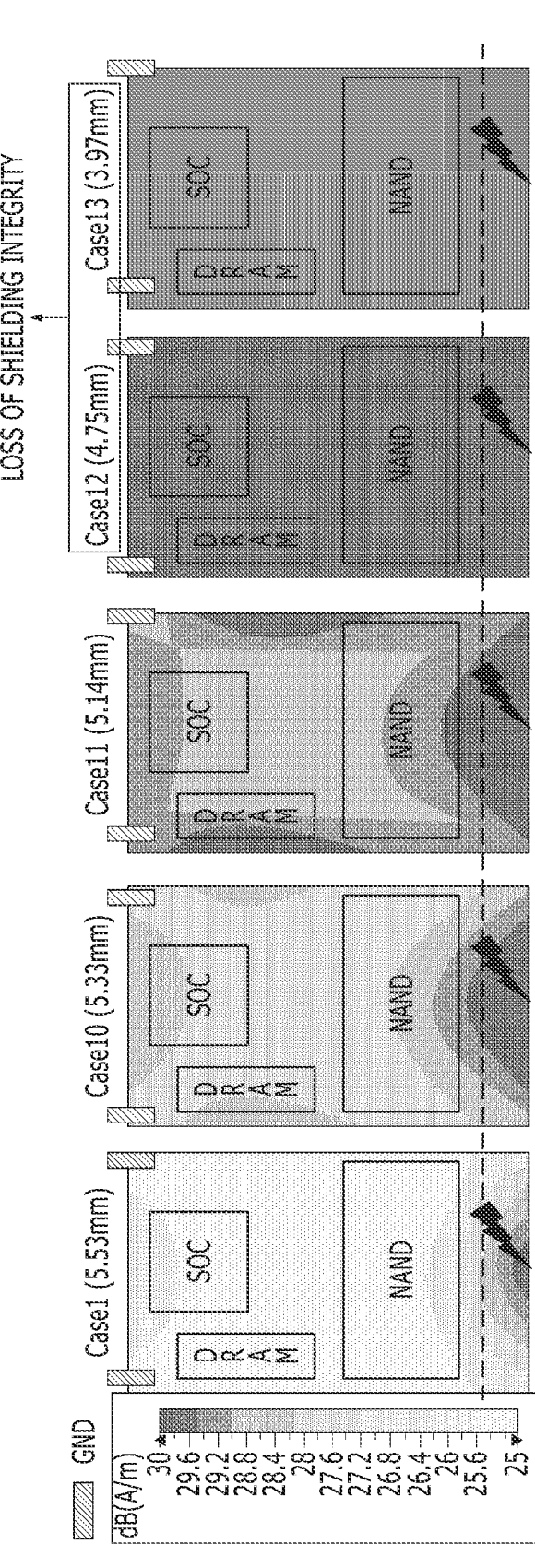

FIGS. 7A and 7B describe a difference in shielding performance according to a change of an outer wall height described in FIG. 4 according to an embodiment of the present disclosure.

Referring to FIG. 7A, the height $H_{Top\_out}$ of the sidewall 126 in the upper case 102 may be designed differently. Referring to FIG. 7A, a case is substantially similar with the coupling structure of the storage device described in FIG. 4. Shielding performance could be different according to the different heights $H_{Top\_out}$ of the sidewall 126.

Referring to FIGS. 7A and 7B, when the height $H_{Top\_out}$ of the sidewall 126 is varied but other components are not changed, a pattern of the magnetic field strength (unit: A/m) could be changed. When the step (height difference) between the sidewall 126 and the inner portion 122 of the upper case 102 is 1.56 mm (Case1, when the height $H_{Top\_out}$ of the sidewall 126 is 5.53 mm in FIG. 7B), an electro-static discharge test (ESD Test) is performed. The ESD test could be performed by lowering the height $H_{Top\_out}$ of the sidewall 126. When the height $H_{Top\_out}$ of the sidewall 126 is changed but other components are not changed, a big difference may occur in a portion where the inner portion 122 and the protrusion 124 are exposed to the outside. For example, when the height $H_{Top\_out}$ of the sidewall 126 is lower than the height $H_{Top\_in}$ of the inner portion 122, which is 3.97 mm (=5.53 mm 1.56 mm) (Case4 to Case5), a crack formed between the inner portion 122 and the protrusion 124 could be exposed to the outside.

Referring to FIG. 7B, the height $H_{Top\_out}$ of the sidewall 126 might be set to 5.53 mm (Case1), 5.33 mm (Case2), 5.14 mm (Case3), 4.75 mm (Case4), and 3.97 mm (Case5) in five cases. Measured patterns of the magnetic field strength (unit: A/m) may be changed due to the surface current of the printed circuit board (PCB). Herein, in all five cases, the height $H_{Top\_out}$ of the sidewall 126 could be greater than the sum of β mm, which is the thickness of the printed circuit board 106, and γ mm, which is the separation distance between the printed circuit board 106 and the upper case 102, as well as lesser than the separation distance between the upper case 102 and the lower case 104. The higher the height $H_{Top\_in}$ of the inner portion 122, the lower the magnetic field strength. The lower the height $H_{Top\_out}$ of the sidewall 126, the higher the magnetic field strength. The higher the height $H_{Top\_out}$ of the sidewall 126, the higher the magnetic field strength. low. Specifically, shielding integrity might be lost when the height $H_{Top\_out}$ of the sidewall 126 is lower than the height $H_{Top\_in}$ of the inner portion 122 (Case4, Case5). Referring to FIGS. 7A and 73, the shielding integrity could be improved as the height $H_{Top\_out}$ of the sidewall 126 increases.

FIGS. 8A to 8E describe a structural difference according to a change of crack location described in FIG. 4 according to an embodiment of the present disclosure, Referring to FIGS. 5A and 53, the height $H_{bot}$ of the protrusion 124 is changed, and the height $H_{Top\_in}$ of the inner portion 122 is changed in FIGS. 6A and 63. In FIGS. 8A to 8E, a difference in shielding performance is tested while changing the heights of the protrusion 124 and the inner portion 122 together, Here, the width and gap $H_{slit}$ of the crack between the inner part 122 and the protrusion 124 could be caused by a tolerance that occurs during an assembly process of the upper case 102 and the lower case 104, By adjusting both heights of the protrusion 124 and the inner portion 122, the width and the gap $H_{slit}$ of the crack formed between the inner part 122 and the protrusion 124 night be maintained for the test at a preset value (e.g., about 0.2 mm or a value corresponding to the assembly tolerance) When the height $H_{bot}$ of the protrusion 124 increases, the height $H_{Top\_in}$ of the inner portion 122 decreases. When the height $H_{bot}$ of the protrusion 124 decreases, the height $H_{Top\_in}$ of the inner portion 122 increases.

Figure 8A:
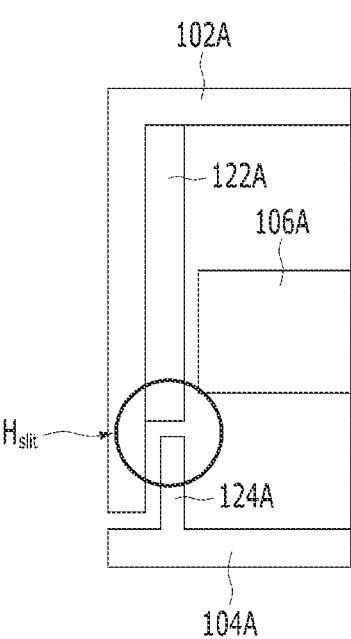
FIGS. 8A to 8E describe a structural difference according to a change of crack location described in FIG. 4 according to an embodiment of the present disclosure.
Figure 8B:
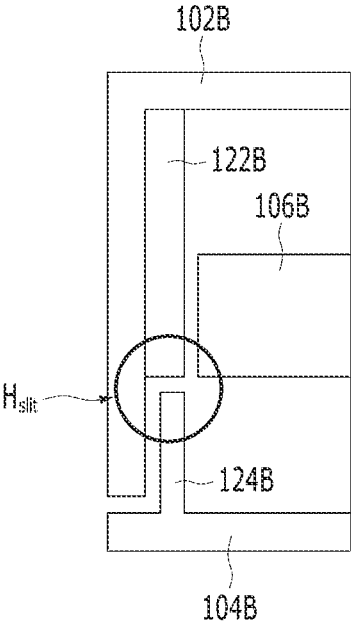
Figure 8C:
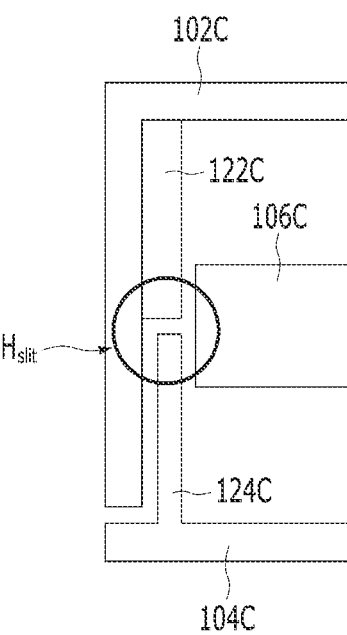
Figure 8D:
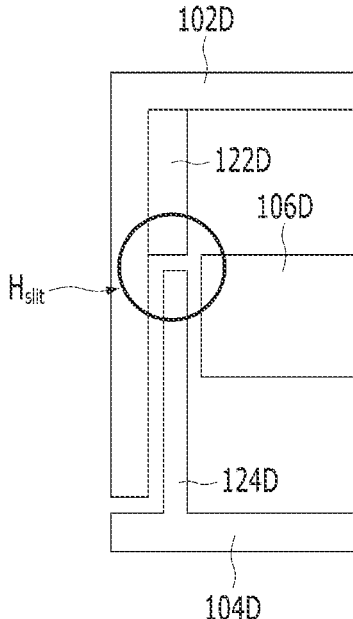
Figure 8E:
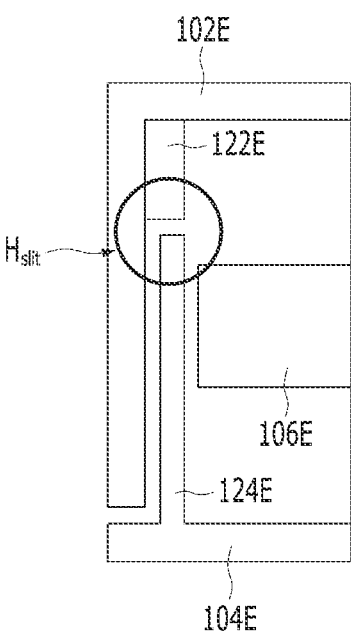

For example, FIG. 8A describes a case where a position of the crack formed between the inner portion 122 and the protrusion 124 is located between the printed circuit board 106 and the lower case 104. However, FIG. 8E illustrates a case where the position of the crack formed between the inner portion 122 and the protrusion 124 is located between the printed circuit board 106 and the upper case 102. FIGS. 8B to 8D illustrate cases where positions of the crack formed between the inner portion 122 and the protrusion 124 are located close to the side of the printed circuit board 106. The heights $H_{Top\_in}$ of the inner portions 122A to 112E described in FIGS. 8A to 8E become shortened, and the heights $H_{bot}$ of the protruding portions 124A to 124E become increased. In these cases, there is no change to the other components of the storage device, such as printed circuit boards 106A to 106E, upper cases 102A to 102E, and lower cases 104A to 104E.

FIGS. 9A to 9E illustrate a difference in shielding performance at a top of the storage device based on the structural difference shown in FIGS. 8A to 8E according to an embodiment of the present disclosure, FIGS. 10A to 10E illustrate a difference in shielding performance at a bottom of the storage device based on the structural difference shown in FIGS. 8A to 8E according to an embodiment of the present disclosure.

FIGS. 9A to 9E are results of measuring the magnetic field strength of the printed circuit board 106 in a direction of the upper case 102, and FIGS. 10A to 10E are results of measuring the magnetic field strength of the printed circuit board 106 in a direction of the lower case 104.

Figure 9A:
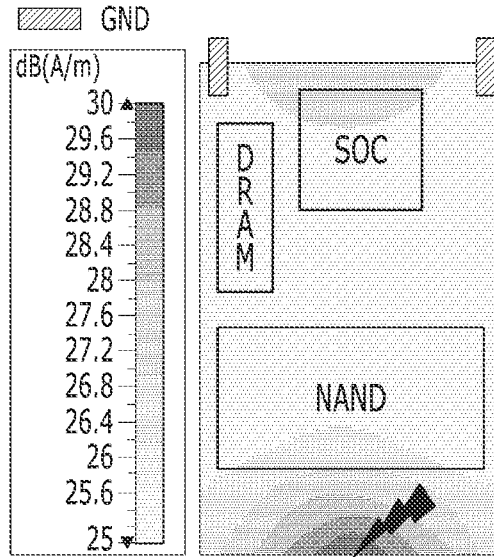
FIGS. 9A to 9E illustrate a difference in shielding performance at a top of the storage device based on the structural difference shown in FIGS. 8A to 8E according to an embodiment of the present disclosure.
Figure 9B:
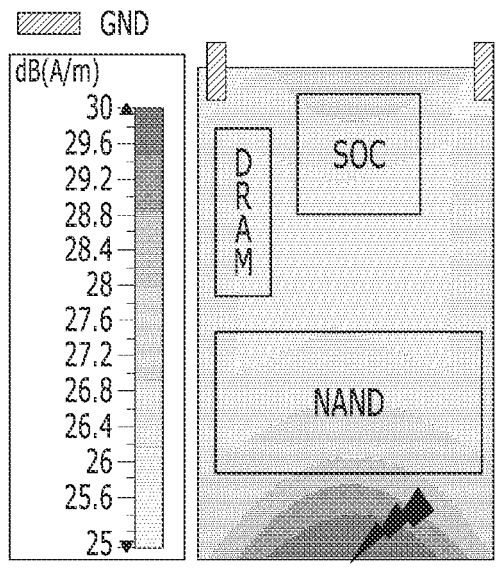
Figure 9C:
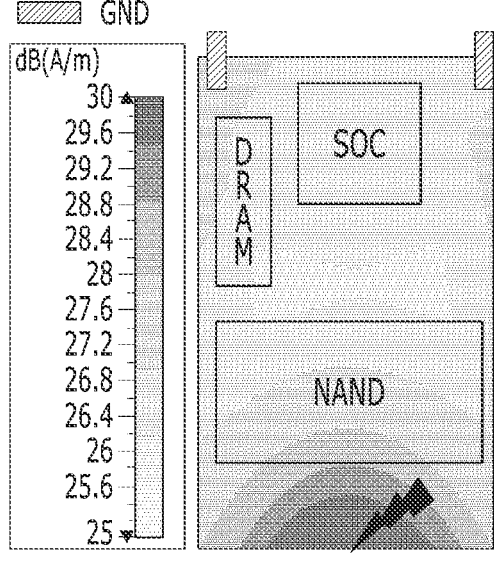
Figure 9D:
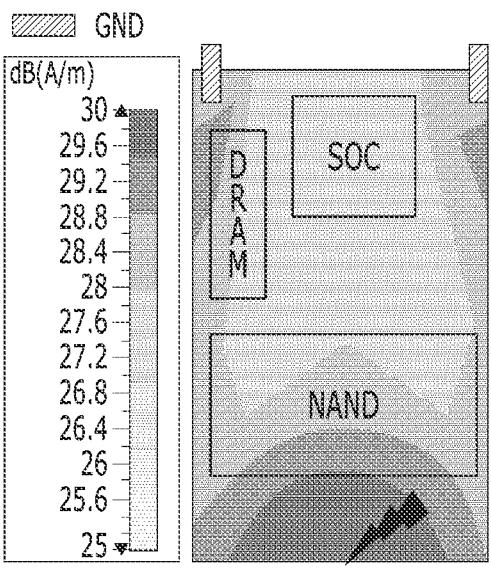
Figure 9E:
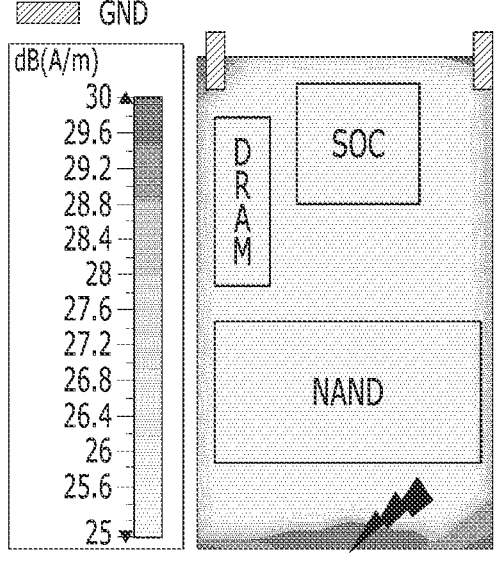

Referring to FIGS. 9A to 9E, a position of the crack formed between the inner portion 122 and the protrusion 124 is close to the side of the printed circuit board 106 (three cases, see FIGS. 9B to 9D). The position of the crack formed between the inner portion 122 and the protrusion 124 is between the printed circuit board 106 and the upper case 102 or lower case 104 (two cases, see FIGS. 9A and 9E). Shielding performance in the two cases is better than that in the three cases.

Figure 10A:
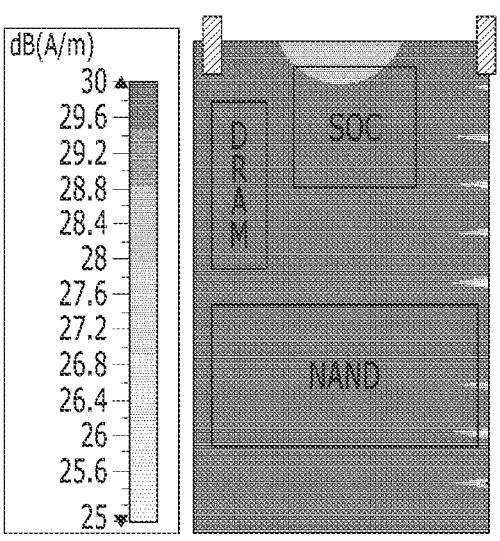
FIGS. 10A to 10E illustrate a difference in shielding performance at a bottom of the storage device based on the structural difference shown in FIGS. 8A to 8E according to an embodiment of the present disclosure.
Figure 10B:
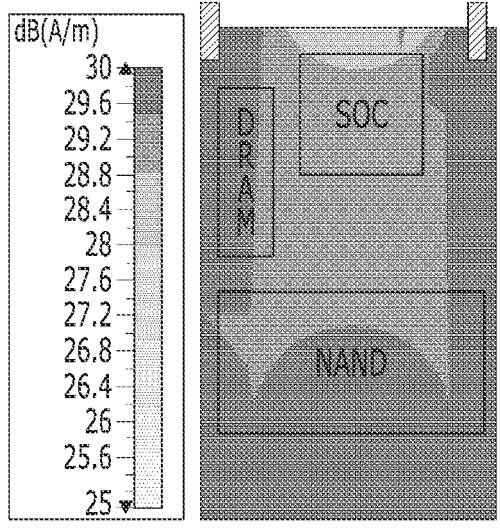
Figure 10C:
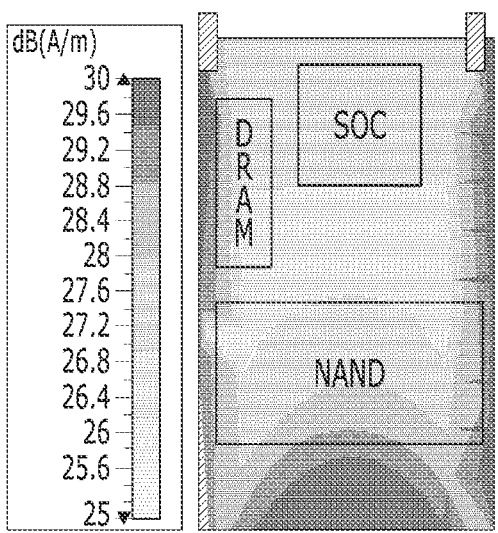
Figure 10D:
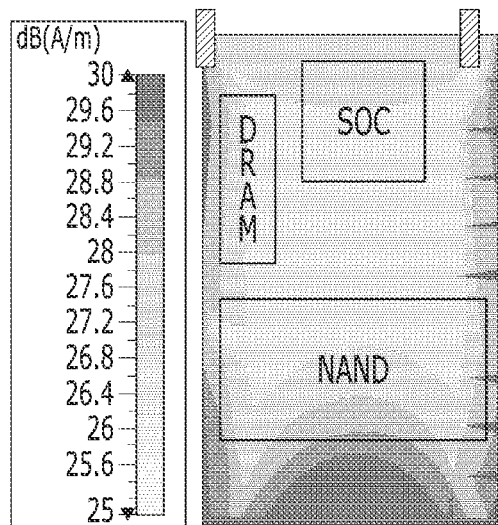
Figure 10E:
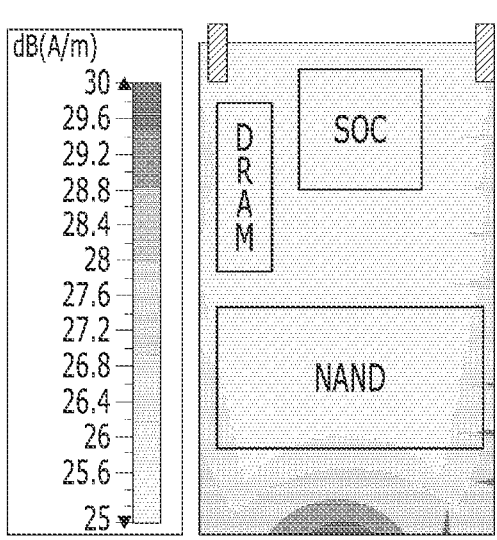

Referring to FIGS. 10A to 10E, when the position of the crack formed between the inner portion 122 and the protrusion 124 is located between the printed circuit board 106 and the lower case 104 shown in FIG. 10A, the shielding performance might be not good. Referring to FIGS. 10A to 10E, when the position of the crack formed between the inner portion 122 and the protrusion 124 is located between the printed circuit board 106 and the upper case 102 shown in FIG. 10E, the shielding performance might be better than the other four cases shown in FIGS. 10A to 10D.

Referring to FIGS. 9A to 10E, when the position of the crack formed between the inner portion 122 and the protrusion 124 is located between the printed circuit board 106 and the upper case 102 shown in FIG. 8E, the shielding performance could be greater than the other four cases shown in FIGS. 8A to 8D. Therefore, when the width and gap $H_{slit}$ of the crack between the inner portion 122 and the protrusion 124 is equally maintained due to a tolerance caused by the assembly process of the upper case 102 and the lower case 104, the shielding performance might be greater as the concavo-convex structure becomes longer by making the height $H_{bot}$ of the protrusion 124 high and the height $H_{Top\_in}$ of the inner part 122 low.

Figure 11A:
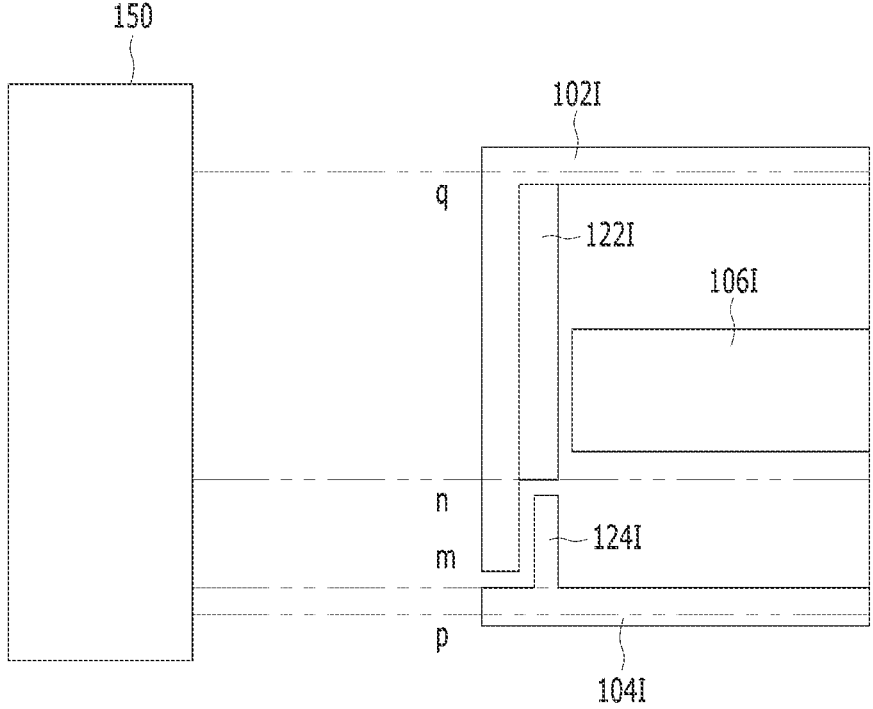
Figure 11B:
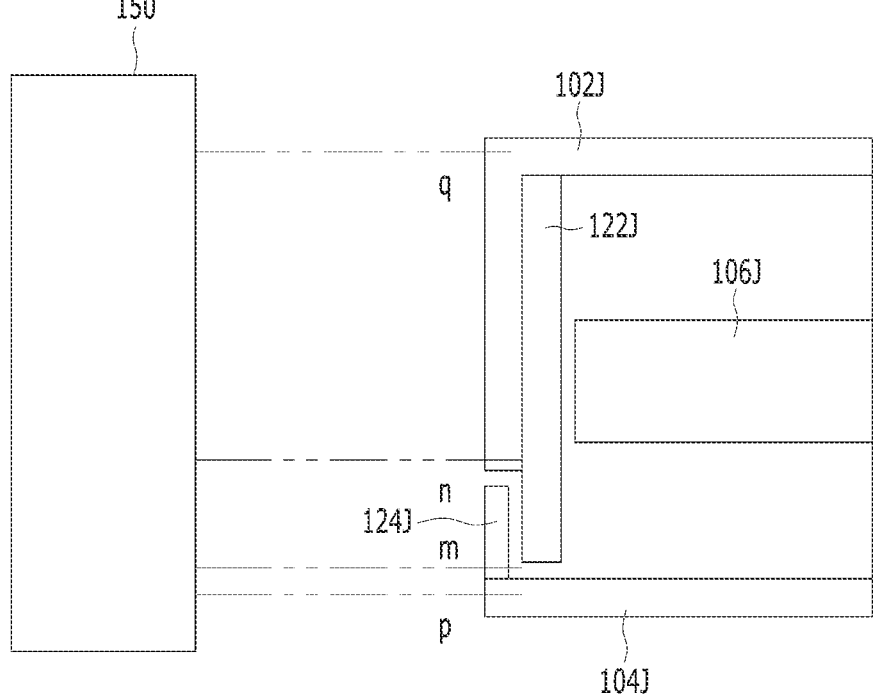

FIGS. 11A and 11B describe a structural difference based on positions of the outer wall and the protrusion described in FIG. 4 according to an embodiment of the present disclosure.

In the storage device illustrated in FIGS. 11A and 11B, there is a change in positional relationships between the protrusions 124I, 124J of the lower cases 104I, 104J and the sidewalls 126I, 126J and the inner portions 122I, 122J of the upper cases 102I, 102J. However, there is no change to the other components of the storage device, such as the printed circuit boards 106A to 106E, the upper cases 102A to 102E, and the lower cases 104A to 104E.

Specifically, referring to FIG. 11A, the sidewall 126I of the upper case 102I is located outside of the protrusion 124I in the lower case 104I, so that the protrusion 124I can respond to the inner portion 122I of the upper case 102I. Referring to FIG. 11B, the protrusion 124J of the lower case 104J is located outside of the inner portion 122J of the upper case 102J, so that the protrusion 124J can correspond to the sidewall 126J of the upper case 102J.

Referring to FIGS. 11A and 11B, static electricity having a voltage level of 4 kV may be applied to two different locations through a device for an electro-static discharge test (e.g., an ESD gun 150). In FIG. 11A, a first position (n) of the two positions can correspond to a crack between the protruding part 124I and the inner part 122I, and a second position (m) can correspond to a crack between the sidewall 126I and the lower case 104I. Although substantially the same position, in FIG. 11B, the first position (n) can correspond to the crack between the protrusion 124J and the side wall 126J, and the second position (m) can correspond to the crack between the inner part 122J and the lower case 104I.

Figure 12A:
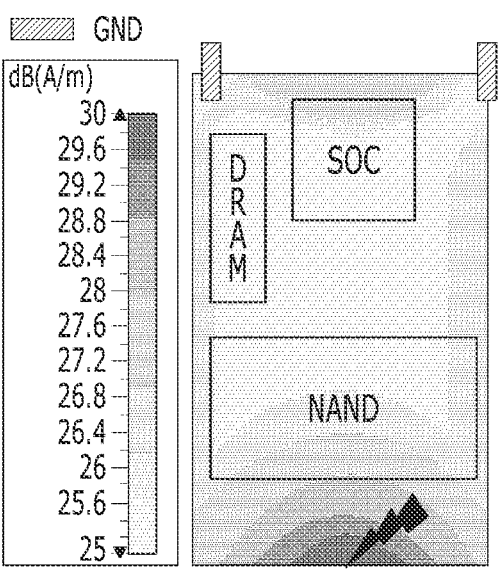
FIGS. 12A to 12D illustrate a difference in shielding performance at a top of the storage device based on the structure difference described in FIGS. 11A and 113 according to an embodiment of the present disclosure.
Figure 12B:
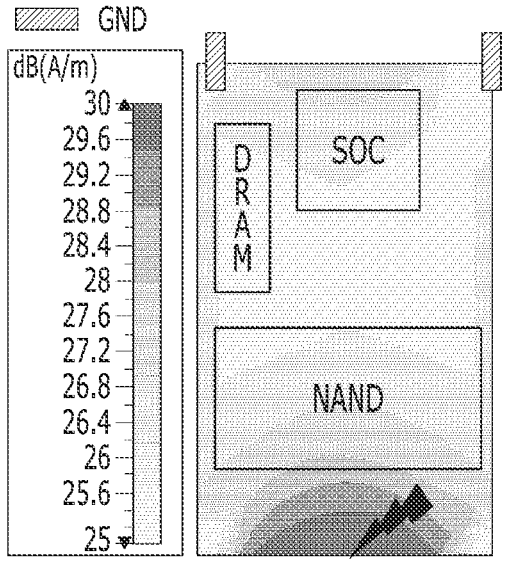
Figure 12C:
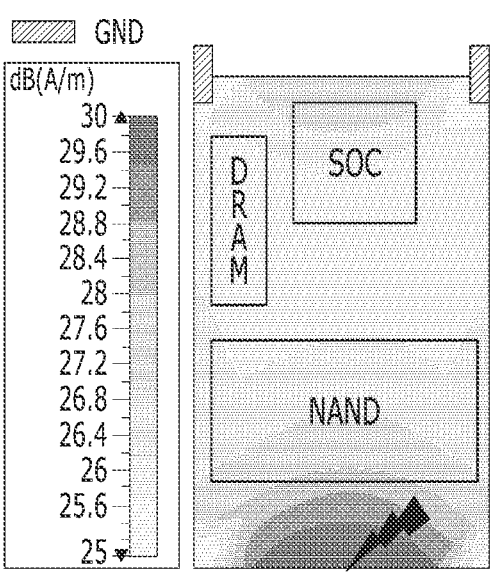
Figure 12D:
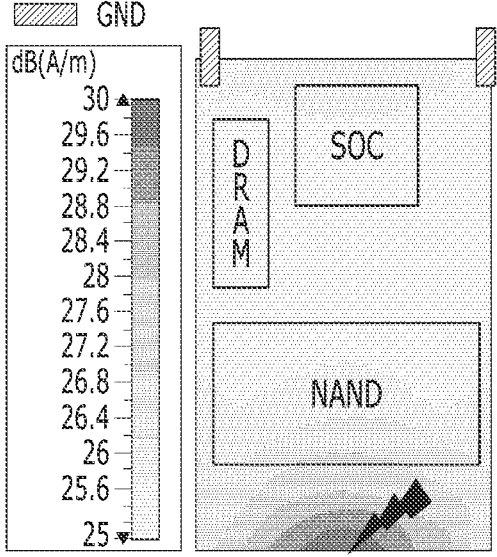

FIGS. 12A to 12D illustrate a difference in shielding performance at a top of the storage device based on the structure difference described in FIGS. 11A and 11B according to an embodiment of the present disclosure. FIG. 12A illustrates the magnetic field strength of the printed circuit board 106I on a side of the upper case 102I when static electricity is applied to the first position (n) in the structure of FIG. 11A. FIG. 12B shows the magnetic field strength of the printed circuit board 106I on a side of the upper case 102I when static electricity is applied to the position (m) in the structure of FIG. 11A. FIG. 12C illustrates the magnetic field strength of the printed circuit board 106J on a side of the upper case 102J side when static electricity is applied to the first position (n) in the structure of FIG. 11B. FIG. 12D shows the magnetic field strength of the printed circuit board 106J on a side of the upper case 102J when static electricity is applied to the position (m) in the structure of FIG. 11B.

Figure 13A:
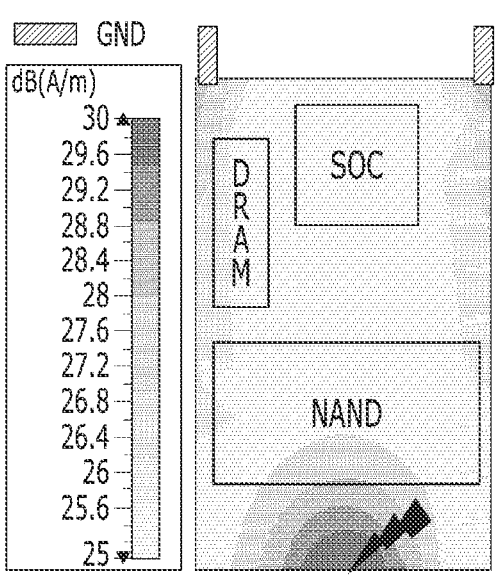
FIGS. 13A to 13D illustrate the difference in shielding performance at a bottom of the storage device based on the structure difference described in FIGS. 11A and 11B according to an embodiment of the present disclosure.
Figure 13B:
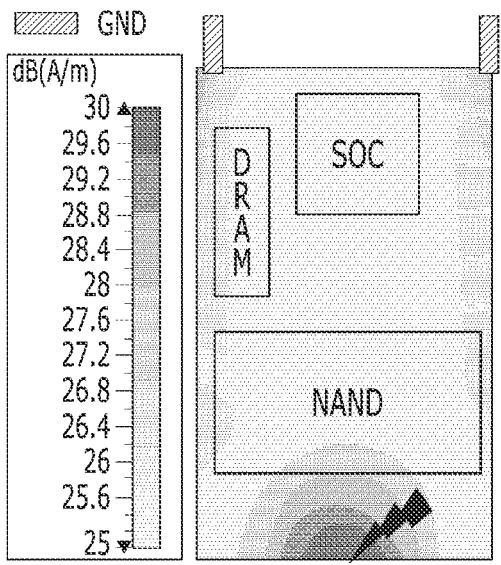
Figure 13C:
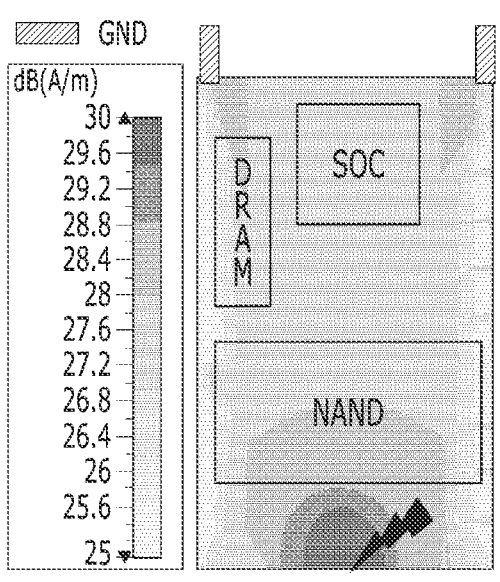
Figure 13D:
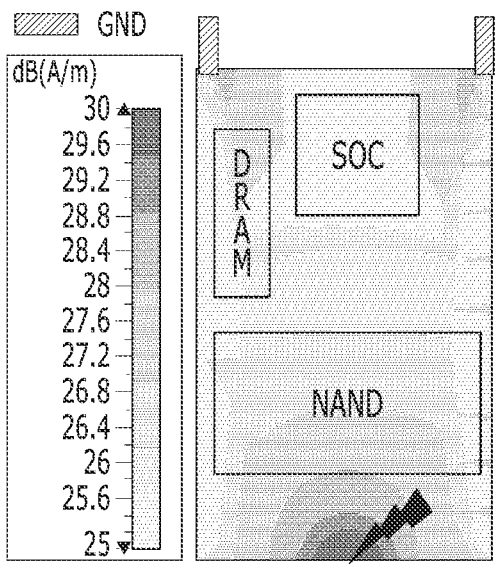

FIGS. 13A to 13D illustrate the difference in shielding performance at a bottom of the storage device based on the structure difference described in FIGS. 11A and 11B according to an embodiment of the present disclosure. FIG. 13A illustrates a pattern of the magnetic field strength in the printed circuit board 106J on a side of the lower case 104J when static electricity is applied to the first position (n) in the structure shown in FIG. 11A. FIG. 13B illustrates a pattern of the magnetic field strength in the printed circuit board 106J on a side of the lower case 104J when static electricity is applied to the second position (m) in the structure shown in FIG. 11B. FIG. 13C describes a pattern of the magnetic field strength in the printed circuit board 106J on a side of the lower case 104J when static electricity is applied to the first position (n) in the structure shown in FIG. 11B, FIG. 13D shows a pattern of the magnetic field strength in the printed circuit board 106J on the side of the lower case 104J when static electricity is applied to the second position (m) in the structure shown in FIG. 11B.

Referring to FIGS. 12A to 13D, when static electricity of 4 kV voltage is applied to a crack exposed to the outside by a device (e.g., ESD Gun 150) for an electrostatic discharge test (e.g., the second position (m) shown in FIG. 11A, the first position (n) shown in FIG. 11B), the magnetic field strength might be increased by about 1 dB (A/m), as compared to other cases. Referring to FIGS. 12A to 13D, the structure in which the protrusion 124I is located in an inner side of the sidewall 126I, described in FIG. 11A, can have better shielding performance than the structure in which the protrusion 124J corresponding to the sidewall 126J is located outside the inner portion 122J, shown in FIG. 11B.

Figure 14A:
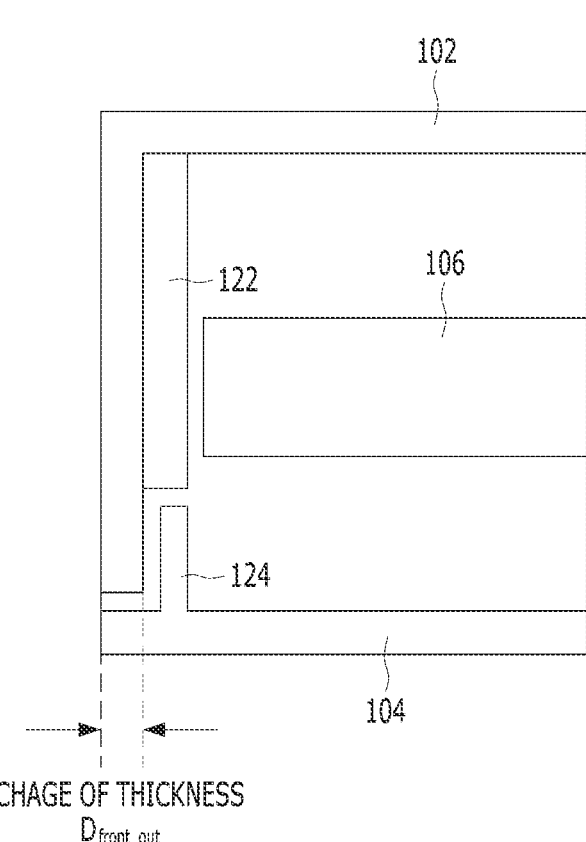
FIGS. 14A and 14B describe a difference in shielding performance according to a change of the outer wall thickness described in FIG. 4 according to an embodiment of the present disclosure.
Figure 14B:
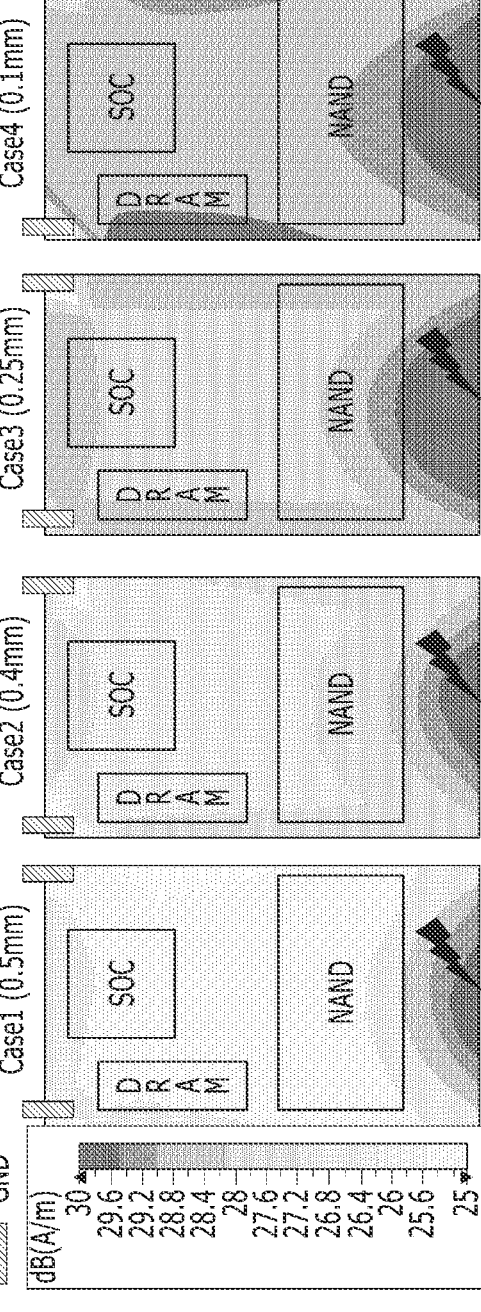

FIGS. 14A and 14B describe a difference in shielding performance according to a change of the outer wall thickness described in FIG. 4 according to an embodiment of the present disclosure.

Referring to FIG. 14A, the thickness $D_{front\_out}$ of the sidewall 126 of the upper case 102 may be designed differently. Referring to FIG. 14A, a case is substantially similar with the coupling structure of the storage device described in FIG. 4. However, shielding performance can be changed based on adjustment of the thickness $D_{front\_out}$ of the sidewall 126.

In FIGS. 14A and 14B, when the thickness $D_{front\_out}$ of the sidewall 126 is varied but other components are not changed, a pattern of the magnetic field strength (unit: A/m) would be changed. The sidewall 126 of the upper case 102 is the outermost structure that protects and covers the side surface of the storage device, and a difference in shielding performance according to a change in the thickness $D_{front\_out}$ of the sidewall 126 is confirmed.

Referring to FIG. 14B, the thickness of the sidewall 126 $D_{front\_out}$ is set to 0.5 mm (Case1), 0.4 mm (Case2), 0.25 mm (Case3), and 0.1 mm (Case4) in four cases. A pattern of the magnetic field strength (unit: A/m) is changed based on the measured surface current (Surface Current) on the printed circuit board (PCB). The thicker the thickness $D_{front\_out}$ of the sidewall 126, the lower the magnetic field strength. As the thickness $D_{front\_out}$ of the sidewall 126 increases, the length of the concavo-convex structure of the upper case 102 and the lower case 104 (that is, length of the crack or gap between the upper case 102 and the lower case 104) could be longer. As the thickness $D_{front\_out}$ of the sidewall 126 increases or the length of the concavo-convex structure increases, shielding performance could be improved.

Referring to FIGS. 11A to 14B, when comparing the cases with the change in the shielding performance according to the position change of the sidewall 126 and the protrusion 124 with the cases with the change in the thickness of the sidewall 126 or the outer wall, the cases with the position change of the sidewall 126 and the protrusion 124 has a greater effect on the shielding performance than the cases with the change in the thickness of the sidewall 126 or the outer wall.

Figure 15A:
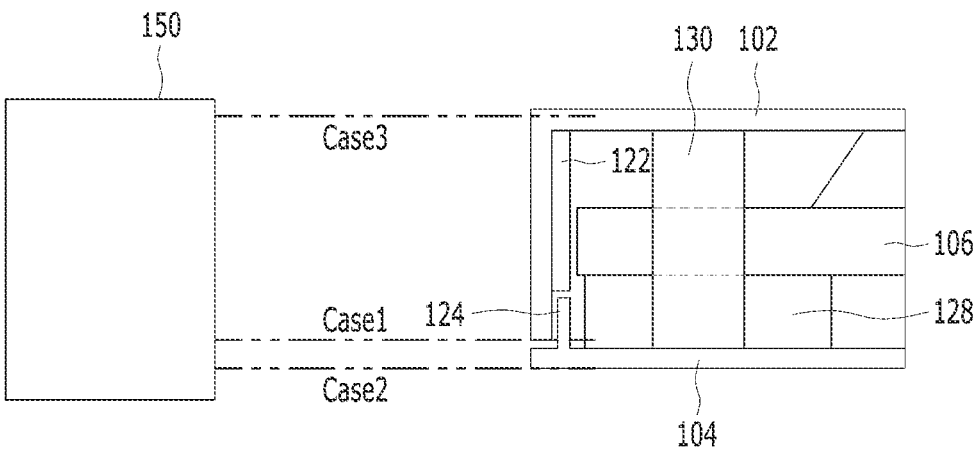
FIGS. 15A to 15C illustrate a difference in shielding performance based on a hole included in the storage device described in FIG. according to an embodiment of the present disclosure.
Figure 15B:
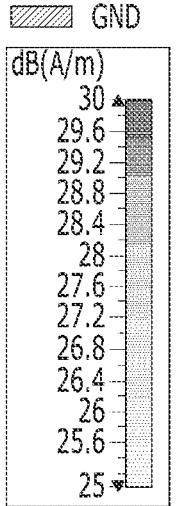
Figure 15B:
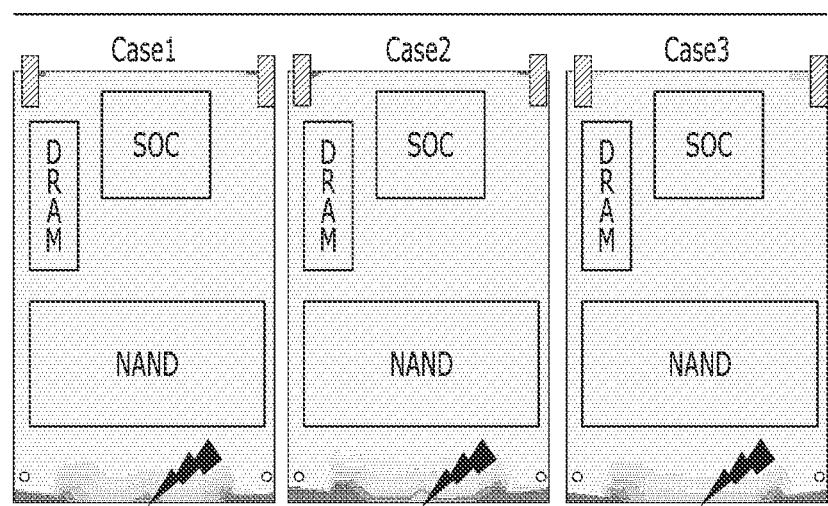
Figure 15C:
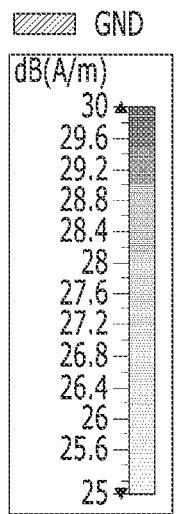
Figure 15C:
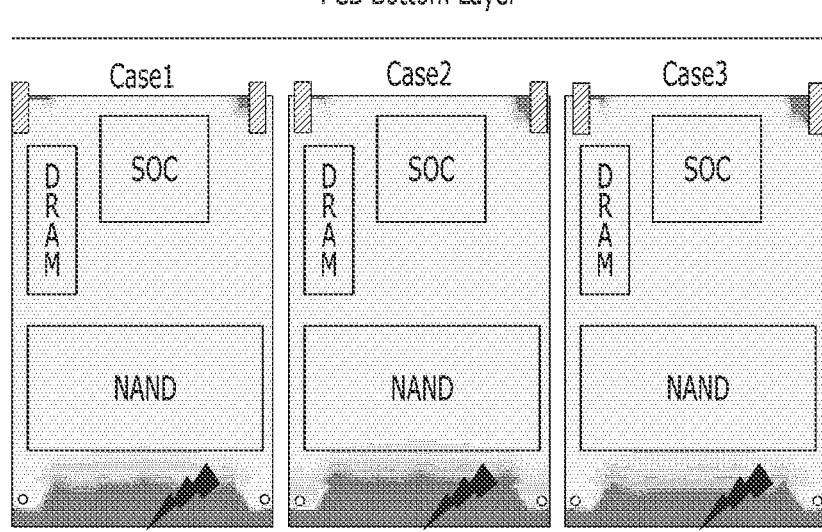

FIGS. 15A to 15C illustrate a difference in shielding performance based on a hole included in the storage device described in FIG. according to an embodiment of the present disclosure.

Referring to FIG. 15A, unlike the storage device described in FIGS. 4 and 15B, the printed circuit board 106 is connected to the upper case 102 and the lower case 104 through a fastening device 128 and the via hole 130. The via hole 130 may have a shape of a hole through which the upper case 102 and the lower case 104 may be coupled with a screw passing through the fastening device 128 and the printed circuit board 106. The via hole 130 may be connected to the ground voltage GND.

Static electricity with a voltage level of 4 kV may be applied to different locations of the storage device through an ESD test device (e.g., ESD Gun 150). Referring to FIG. 15A, three cases are compared with each other. In a first case (Case1), static electricity with a voltage level of 4 kV is applied to the crack caused by the assembly process of the upper case 102 and the lower case 104. In a second case (Case2), static electricity with the voltage level of 4 kV is applied to the lower case 104. In a third case (Case3), static electricity with the voltage level of 4 kV is applied to the upper case 102.

When static electricity of 4 kV voltage is applied to three different positions as shown in FIG. 15A, FIG. 15B describes the results of measuring the magnetic field strength of the printed circuit board in a direction of the upper case 102, and FIG. 15C shows the results of measuring the magnetic field strength of the printed circuit board in a direction of the lower case 104. Referring to FIGS. 15B and 15C, both the magnetic field strength measured from a side of the upper case 102 and the magnetic field strength measured from a side of the lower case 104 are low, even though applied positions are different. Referring to FIGS. 15B and 15C, shielding performance in the case where the upper case 102 and the lower case 104 is coupled through the via hole 130 (see FIG. 16A) could be better than that in the case where the fastening device 128 is added between the printed circuit board 106 and the lower case 104 (see FIG. 15A), Specifically, when the upper case 102 and the lower case 104 are coupled through the via hole 130, the magnetic field strengths of the printed circuit board in both sides of the upper case 102 and the lower case 104 could be low, so that shielding performance could be improved by the via hole 130.

FIGS. 16A to 16D describe a difference in shielding performance according to the presence or absence of a carrier which is combined with the storage device described in FIG. 1 according to an embodiment of the present disclosure.

Figure 16A:
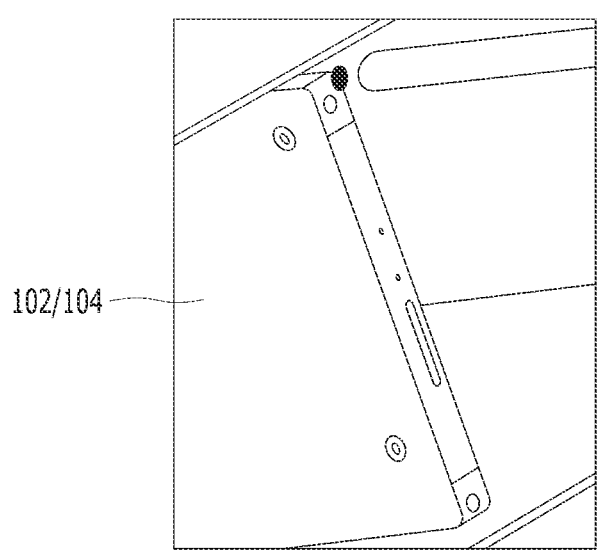
FIGS. 16A to 16D describe a difference in shielding performance according to the presence or absence of a carrier which is combined with the storage device described in FIG. 1 according to an embodiment of the present disclosure.
Figure 16B:
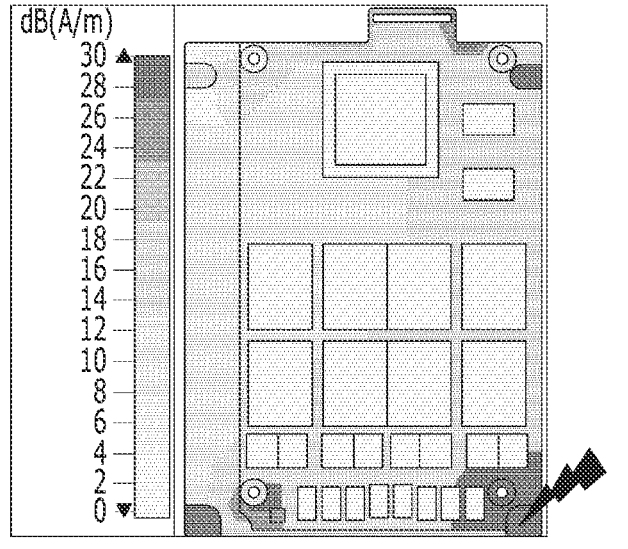
Figure 16B:
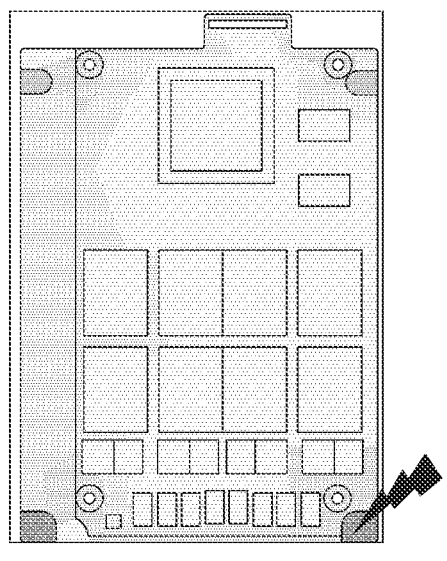
Figure 16C:
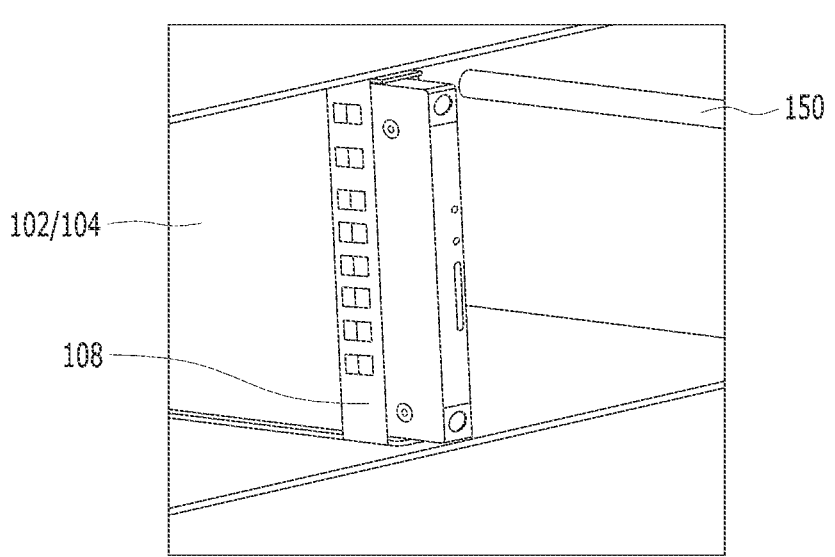

Referring to FIGS. 16A and 16C, the upper case 102 and the lower case 104 of the storage devices are arranged in a rack which is designed for arranging a plurality of storage devices in a row direction, a column direction, or a row and column direction. Specifically, FIG. 16A illustrates a structure in which the upper case 102 and the lower case 104 of the storage device are coupled to the rack without a carrier, and FIG. 16C illustrates a structure in which the upper case 102 and the lower case 104 of the storage device are coupled to the rack through a carrier 108. Here, the carrier 108 may be connected to the ground voltage GND through at least one terminal. For example, the carrier 108 may cover at least a portion of the side, front, or rear surface of the storage device. The carrier 108 may be directly contacted to the upper case 102 and the lower case 104 of the storage device. Through the carrier 108, the storage device and the rack may be fastened, separated, or coupled through a bolt, a bracket, a lever, a socket, or the like.

The rack may include plural means, each configured to be coupled to each of the plurality of storage devices 550. The plurality of storage devices may be connected to each other or to an external device through an interconnect device including a plurality of wires and a switching device.

Figure 16D:
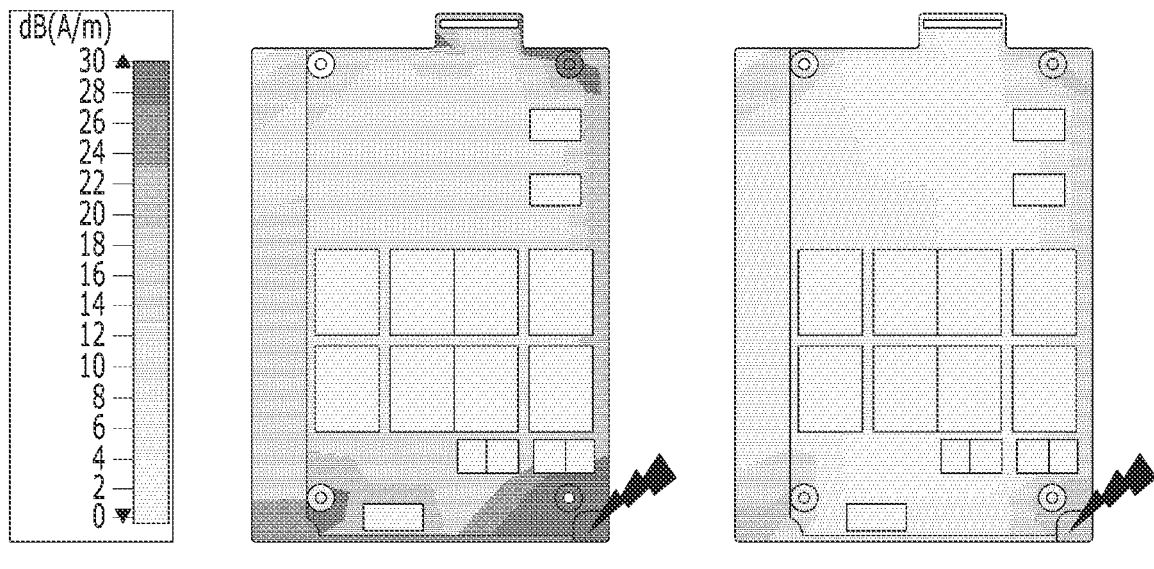

FIG. 16B shows results of measuring the magnetic field strength of the printed circuit board in both sides of the upper case 102 (left) and the lower case 104 (right) when the carrier described in FIG. 16A does not exist. FIG. 16D shows results of measuring the magnetic field strength of the printed circuit board in both sides of the upper case 102 (left) and the lower case 104 (right) when the carrier described in FIG. 16C is included.

Referring to FIGS. 16B and 16D, a difference in magnetic field strength of 6 dB (A/m) or more may occur according to the presence of the carrier 108. As two cases are compared with each other, the case in which the carrier 108 is included may have greater shielding performance than the case in which the carrier 108 is not included. Accordingly, the carrier 108 could improve shielding performance of the storage device.

As above described, a storage device according to an embodiment of the present disclosure can avoid or reduce a damage caused by electro-static discharge (ESD).

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments

What is claimed is:

1. A storage device comprising:
   a printed circuit board (PCB) with attached semiconductor chips, each including a memory, and with at least one wire coupling the semiconductor chips; and
   a case comprising a first case surrounding a top portion of the printed circuit board and a second case surrounding a bottom portion of the printed circuit board,
   wherein a flat sidewall of the first case and a protrusion of the second case form a stepped bending structure, the protrusion surrounded by the flat sidewall,
   the flat sidewall of the first case is coupled to an inner portion which extends partially downward and along the flat sidewall and faces the protrusion of the second case,
   both the flat sidewall of the first case extending below a lower surface of the printed circuit board and the protrusion of the second case extending above an upper surface of the printed circuit board cover all of a side of the printed circuit board, and
   the inner portion extending partially downward and along the flat sidewall of the first case and the protrusion of the second case extending above the upper surface of the printed circuit board are separated by a slit present above the printed circuit board, and
   the inner portion, extending partially downward and along the flat sidewall of the first case, stops above the slit present above the printed circuit board such that the slit above the printed circuit board provides electromagnetic shielding.

2. The storage device according to claim 1, further comprising a carrier attached with the case and configured to couple the case to a rack which is capable of arranging plural storage devices in a row direction, a column direction, or row and column directions,
   wherein the carrier comprises at least one component coupled to a ground voltage.

3. The storage device according to claim 1, wherein the flat sidewall meets the protrusion, when the first case and the second case are joined to each other, such that a crack between the flat sidewall and the protrusion in the stepped bending structure extends from between the printed circuit board and the second case to between the printed circuit board and the first case, and
   wherein the crack is between the protrusion and the inner portion.

4. The storage device according to claim 3, wherein a side of the protrusion facing the side of the printed circuit board is flat.

5. The storage device according to claim 4,
   wherein the inner portion is spaced apart from the inner side of the flat sidewall to form a trench between the flat sidewall and the inner portion of the first case,
   wherein the protrusion is inserted into the trench when the first case and the second case are joined to each other.

6. The storage device according to claim 3,
   wherein the first case and the second case have a detachable structure, and
   wherein the crack correlates with an assembly tolerance of the first case and the second case.

7. The storage device according to claim 3, wherein the crack is extended from a bottom of the second case to a top of the first case.

8. The storage device according to claim 1,
   wherein the flat sidewall of the first case is arranged outside the protrusion of the second case, and
   wherein the protrusion of the second case is arranged with the printed circuit board in a space formed by the flat sidewall of the first case.

9. The storage device according to claim 1, wherein the PCB has a hole, through which the first case and the second case are to be coupled to each other.

10. An electrical apparatus comprising:

a printed circuit board; and first and second cases covering a top and a bottom of the printed circuit board, wherein the first and second cases are detachable, and wherein a flat sidewall of the first case extending below a lower surface of the printed circuit board and a protrusion of the second case extending above an upper surface of the printed circuit board cover all of a side of the printed circuit board, the protrusion surrounded by the flat sidewall, wherein a side of the protrusion facing the side of the printed circuit board is flat, wherein the flat sidewall of the first case is coupled to an inner portion which extends partially downward and along the flat sidewall of the first case and faces the protrusion of the second case, and wherein the inner portion, extending partially downward and along the flat sidewall of the first case, stops above a slit present above the printed circuit board such that the slit above the printed circuit board provides electromagnetic shielding.

11. The electrical apparatus according to claim 10, wherein the inner portion of the first case and the protrusion of the second case extending above the upper surface of the printed circuit board are separated by the slit present above the printed circuit board.

12. The electrical apparatus according to claim 11, wherein the inner portion and the flat sidewall are attached to each other without any space therebetween.

13. The electrical apparatus according to claim 11, wherein the protrusion is inserted into a trench formed between the inner portion and spaced apart from the inner side of the flat sidewall.

14. The electrical apparatus according to claim 13, wherein the inner portion and the protrusion have a same height.

15. The electrical apparatus according to claim 11, wherein the flat sidewall, the protrusion, and the inner portion forms a stepped bending structure, and wherein a crack between the flat sidewall and the protrusion extends from between the printed circuit board and the second case to between the printed circuit board and the first case.

16. The electrical apparatus according to claim 15, wherein the crack correlates with an assembly tolerance of the first case and the second case.

17. The electrical apparatus according to claim 16, further comprising a carrier attached with the case and configured to couple the case to a rack which is capable of arranging plural storage devices in a row direction, a column direction, or row and column directions.

18. The electrical apparatus according to claim 17, wherein the carrier comprises at least one component coupled to a ground voltage.

19. The electrical apparatus according to claim 10, wherein the printed circuit board has a hole, through which the first case and the second case are to be coupled to each other.

20. The electrical apparatus according to claim 10, wherein the printed circuit board is spaced apart respectively from the first case and the second case by a same distance.

\* \* \* \* \*